(12) United States Patent
Tang et al.

(10) Patent No.: US 9,654,120 B2
(45) Date of Patent: May 16, 2017

(54) SYSTEM AND METHOD OF DETERMINING AN OSCILLATOR GAIN

(75) Inventors: Yiwu Tang, San Diego, CA (US); Yunliang Zhu, San Diego, CA (US); Chiewcharn Narathong, San Diego, CA (US); Sujiang Rong, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 376 days.

(21) Appl. No.: 13/559,167

(22) Filed: Jul. 26, 2012

(65) Prior Publication Data

US 2014/0031076 A1    Jan. 30, 2014

(51) Int. Cl.
*H04B 1/40* (2015.01)
*H03L 7/099* (2006.01)
*G01R 31/28* (2006.01)
*H03L 7/07* (2006.01)
*H03B 21/01* (2006.01)

(52) U.S. Cl.
CPC .......... *H03L 7/099* (2013.01); *G01R 31/2832* (2013.01); *H03B 21/01* (2013.01); *H03L 7/07* (2013.01)

(58) Field of Classification Search
CPC .................................... H04B 1/0082
USPC ......................................... 455/76
See application file for complete search history.

(56) References Cited

U.S. PATENT DOCUMENTS

| | | |
|---|---|---|
| 5,572,168 A | 11/1996 | Kasturia |
| 6,404,293 B1 | 6/2002 | Darabi et al. |
| 7,474,878 B1 * | 1/2009 | Hietala et al. .............. 455/126 |
| 7,898,343 B1 * | 3/2011 | Janesch ..................... 331/16 |
| 8,058,933 B2 | 11/2011 | Frank et al. |
| 2005/0181752 A1 * | 8/2005 | Sahota ............... H04B 7/0837 455/132 |
| 2007/0103248 A1 * | 5/2007 | Nakamura et al. ......... 331/167 |
| 2007/0105513 A1 | 5/2007 | Son et al. |
| 2012/0064839 A1 | 3/2012 | Yang et al. |

FOREIGN PATENT DOCUMENTS

GB    2408398 A    5/2005

OTHER PUBLICATIONS

Ahn, et al., "VCO Gain Calibration Technique for GSM/EDGE Polar Modulated Transmitter," IEEE Radio Frequency Integrated Circuits Symposium, Jul. 2008, pp. 383-386, Yongin-City, KR.
Darabi, et al., "A Quad-Band GSM/GPRS/EDGE SoC in 65nm CMOS," IEEE Journal of Solid-State Circuits, Apr. 2011, pp. 870-882, vol. 46, No. 4.
Lee, et al., "Self-Calibrated Two-Point Delta-Sigma Modulation Technique for RF Transmitters," IEEE Transactions on Microwave Theory and Techniques, Jul. 2010, pp. 1748-1757, vol. 58, No. 7.

(Continued)

*Primary Examiner* — Nay A Maung
*Assistant Examiner* — Angelica M Perez
(74) *Attorney, Agent, or Firm* — Rupit M. Patel

(57) ABSTRACT

A method includes generating a first signal based on a difference between a first frequency of a first voltage controlled oscillator (VCO) and a second frequency of a second VCO. The method further includes determining a gain of the first VCO at least partially based on the first signal.

26 Claims, 17 Drawing Sheets

(56) References Cited

OTHER PUBLICATIONS

Nilsson, et al., "A 9-band WCDMA/EDGE transceiver supporting HSPA evolution," Digest of Technical Papers IEEE Solid-State Circuits Conference (ISSCC) 2011, pp. 366-368.
Yu, et al., "A 0.65-V 2.5-GHz Fractional-N Synthesizer with Two-Point 2-Mb/s GFSK Data Modulation," IEEE Journal of Solid-State Circuits, Sep. 2009, pp. 2411-2425, vol. 44, No. 9.
Yu, et al., "A 5.5mA 2.4-GHz Two-Point Modulation Zigbee Transmitter with Modulation Gain Calibration," IEEE Custom Intergrated Circuits Conference, 2009, pp. 375-378.
International Search Report and Written Opinion—PCT/US2013/052331—ISA/EPO—Oct. 22, 2013.

\* cited by examiner

SYSTEM AND METHOD OF DETERMINING AN OSCILLATOR GAIN

I. FIELD

The present disclosure is generally related to determining a gain of an oscillator.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

The circuitry within wireless telephones and other electronic devices may be subject to process, voltage, and temperature (PVT) variations. As an example, performance of a voltage controlled oscillator (VCO) may vary based on the PVT conditions. In particular, a receiver of a modem may include a VCO that is highly sensitive to PVT variations. The VCO gain may need to be calibrated during a limited time period in response to variations, such as temperature increases, without an accompanying phase lock loop (PLL) going out of lock during the calibration. For example, to comply with a Wideband Code Division Multiple Access (WCDMA) protocol standard, a gain variation of a VCO may need to be calibrated within 25 microseconds using automatic gain control (AGC) due to a temperature variation in a mobile phone.

The overall performance and reliability of a PLL may be affected by the gain of an oscillator (e.g., a voltage-controlled oscillator (VCO) in the PLL). For example, if the gain of a VCO is too flat (i.e., the frequency range corresponding to the tuning voltage range is small), the VCO may not provide a sufficient frequency coverage margin for use in electronic devices. Conversely, if the gain of the VCO is too steep (i.e., the frequency range corresponding to the tuning voltage range is large), the VCO may experience increased noise and instability. In addition, the VCO gain variation may affect a frequency synthesizer's dynamic behavior and thus the frequency synthesizer's lock time and noise performance. In polar transmitter architecture using phase two point modulation, a VCO gain variation may be subject to a given range depending on wireless protocols. Since VCO gain variation over PVT variations is inevitable, fast VCO gain calibration is needed to compensate for the VCO gain variation and to maintain a constant gain.

III. SUMMARY

A gain of a first voltage controlled oscillator (VCO) may be determined by comparing a first frequency of the first VCO to a second frequency of a second VCO. The comparison may be in the form of a delta frequency signal corresponding to the difference of the first frequency and the second frequency. The delta frequency signal may be generated by down-converting the first frequency to enable the first VCO to be calibrated at a higher accuracy in a shorter time period. The delta frequency signal may periodically enable a counter, and the counter may count a number of reference clock signals that occur during an enabling portion of the delta frequency signal. The gain of the first VCO may be determined using a closed phase lock loop (PLL) initialization process or by using an open loop PLL initialization process.

In a particular embodiment, a method includes generating a first signal based on a difference between a first frequency of a first voltage controlled oscillator (VCO) and a second frequency of a second VCO. The method further includes determining a first gain of the first VCO at least partially based on the first signal.

In another particular embodiment, an apparatus includes a down-conversion circuit having a first input coupled to receive a first voltage controlled oscillator (VCO) output signal from a first VCO of a first phase lock loop (PLL) during a VCO gain calibration of the first PLL. The down-conversion circuit further includes a second input coupled to receive a second VCO output signal from a second VCO. The apparatus further includes a frequency counter coupled to receive a first signal from an output of the down-conversion circuit. The first signal is based on a difference between a first frequency of the first VCO output signal and a second frequency of the second VCO output signal. The frequency counter is further configured to generate a counter output that is proportional to the difference between the first frequency and the second frequency.

One particular advantage provided by at least one of the disclosed embodiments is an ability to quickly calibrate a gain of a VCO using automatic gain control (AGC), such as within a 25 microsecond (µs) period according to a Wideband Code Division Multiple Access (WCDMA) protocol. Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
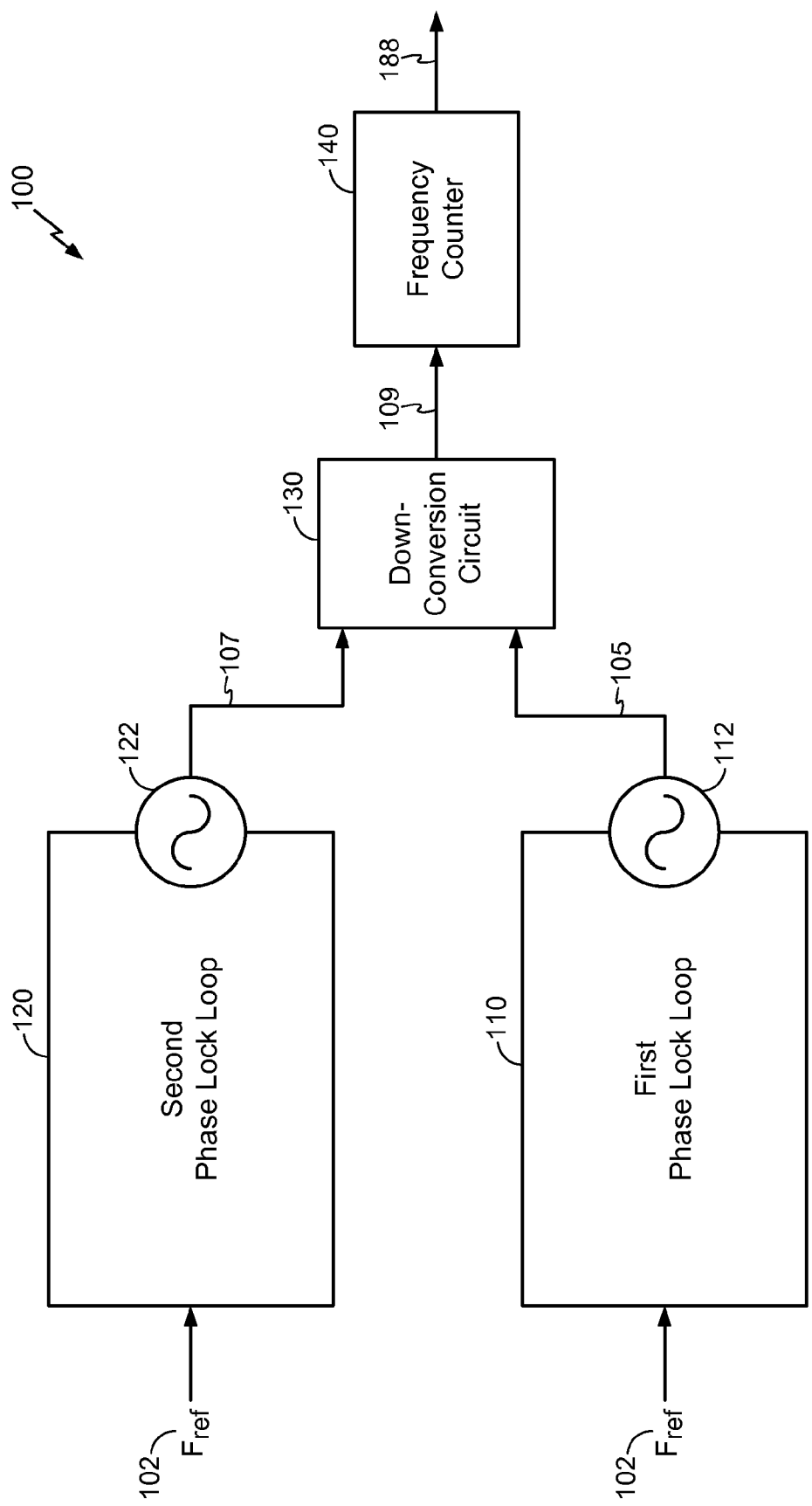
FIG. 1 is a block diagram of a particular illustrative embodiment of a system operable to determine a gain of an oscillator.

Referring to FIG. 1, a particular illustrative embodiment of a system 100 that is operable to determine a gain of an oscillator is shown. The system 100 includes a first phase lock loop (PLL) 110, a second PLL 120, a down-conversion circuit 130, and a frequency counter 140. The first PLL 110 includes a first voltage controlled oscillator (VCO) 112 and the second PLL 120 includes a second VCO 122. An output 105 of the first VCO 112 is coupled to a first input of the down-conversion circuit 130 and an output 107 of the second VCO 122 is coupled to a second input of the down-conversion circuit 130. An output 109 of the down-conversion circuit 130 is coupled to an input of the frequency counter 140.

The first PLL 110 is configured to receive a reference signal 102 having a reference frequency ($F_{ref}$). The first VCO 112 is configured to generate a VCO output signal 105 having a VCO frequency ($F_{VCO}$). The VCO output signal 105 is provided to the first input of the down-conversion circuit 130.

The second PLL 120 may be in a reusable synthesizer circuit. The second PLL 120 is configured to receive the reference signal 102 having the reference frequency ($F_{ref}$). The second VCO 122 is configured to generate a second VCO output signal 107 having a second frequency ($F_2$). The second VCO output signal 107 is provided to the second input of the down-conversion circuit 130. The second frequency ($F_2$) of the second VCO output signal 107 may be equal to or approximately equal to the reference frequency ($F_2 \approx F_{ref}$). For example, the second frequency ($F_2$) may be within 1 part per million (ppm) of the reference frequency ($F_{ref}$).

The down-conversion circuit 130 is configured to receive the VCO output signal 105 at the first input and to receive the second VCO output signal 107 at the second input. The down-conversion circuit 130 is configured to generate a delta frequency signal 109 based on a difference between the VCO frequency ($F_{VCO}$) of the VCO output signal 105 and the second frequency ($F_2$) of the second VCO output signal 107. In a particular embodiment, the down-conversion circuit 130 may include a D-type flip flop (DFF), such as described with respect to FIG. 10. For example, the down-conversion circuit may include a high-speed DFF. In an alternate embodiment, the down conversion circuit 130 may include an exclusive-or (XOR) gate or a mixer, such as described with respect to FIGS. 11 and 12, respectively. The delta frequency signal 109 is provided to an input of the frequency counter 140.

The frequency counter 140 is configured to receive the delta frequency signal 109 and to generate a counter output signal 188 based at least partially on the delta frequency signal 109. For example, the delta frequency signal 109 may enable the frequency counter 140 or an enabling portion there of (e.g., corresponding to when the delta frequency signal 109 provides a logic high signal to an enable input of the frequency counter 140). The frequency counter 140 may generate the counter output signal 188 by counting a number of cycles of a reference clock that occurs during the enabling portion.

During operation, the system 100 may undergo an initialization process. For example, the first PLL 110 receives the reference signal 102 having the reference frequency ($F_{ref}$) and the first VCO 112 outputs the VCO output signal 105 having an initial frequency ($F_{int}$). The second PLL 120 receives the reference signal 102 having the reference frequency ($F_{ref}$) and the second VCO 122 outputs the second VCO output signal 107 having the second frequency ($F_2$). The down-conversion circuit 130 receives the VCO output signal 105 having the initial frequency ($F_{int}$) and the second VCO output signal 107. The down-conversion circuit 130 generates the delta frequency signal 109 based on the difference between the initial frequency ($F_{int}$) of the VCO output signal 105 and the second frequency ($F_2$) of the second VCO output signal 107. The frequency counter 140 generates the counter output signal 188 in response to receiving the delta frequency signal 109. The initialization process may be closed looped as described with respect to FIGS. 3-6 or open looped as described with respect to FIGS. 7-9.

After the initialization process, a change may be applied to the first VCO 112 which may change the frequency of the VCO output signal 105. For example, as described in further detail with respect to FIGS. 2-9, a voltage may be applied to the first VCO 112 which may change the frequency of the VCO output signal 105 from the initial frequency ($F_{int}$) to a first frequency ($F_1$). The VCO output signal 105 is provided to the down-conversion circuit 130 and the down-conversion circuit 130 generates the delta frequency signal 109 based on the difference between the first frequency ($F_1$) of the VCO output signal 105 and the second frequency ($F_2$) of the second VCO output signal 107 (e.g., $F_1$-$F_2$). The frequency counter 140 generates the counter output signal 188 in response to receiving the delta frequency signal 109.

Changes in the counter output signal 188 after the initialization process may correspond to a VCO gain of the first VCO 112. For example, the VCO gain of the first VCO 112 may be determined as a change in frequency at the first VCO 112 divided by a change in voltage applied to the first VCO 112. The VCO gain determination process may be repeated at a different VCO tuning voltage corresponding to a different VCO frequency (e.g., multi-point calibration) for calibration coverage over a larger frequency range, where the determined gain of the first VCO 112 is computed by averaging the gains for each VCO tuning voltage utilized. The VCO gain may be used to calibrate the first VCO 112.

It will be appreciated that determining the gain of the first VCO 112 using the difference between the first frequency ($F_1$) of the first VCO 112 and the second frequency ($F_2$) of the second VCO 122 may result in a faster calibration process with increased accuracy as compared to directly measuring the first frequency ($F_1$). For example, using the difference between first frequency ($F_1$) and the second frequency ($F_2$), where ($F_2 \approx F_{ref}$), may allow an automatic gain controller (AGC) circuit (not shown) to compare the first frequency ($F_1$) to the reference frequency ($F_{ref}$) using a single measurement rather than measuring the first frequency ($F_1$) in a first measurement and measuring the reference frequency ($F_{ref}$) in a second measurement. As the number of measurements increases, chances for error may increase due to PVT effects. It will also be appreciated that using a two-step calibration technique may reduce or remove a phase accumulation of the first PLL 110 that results from changing the voltage applied to the first VCO 112. For example, increasing the initial voltage applied to the first VCO 112 by an offset voltage for a first time period ($T_1$) may result in a phase accumulation of the first PLL. Decreasing the initial voltage applied to the first VCO by the offset voltage for a second time period ($T_2$) approximately equal to the first time period (i.e., $T_1 \approx T_2$) may reduce the magnitude of the phase accumulation caused by increasing the initial voltage.

Figure 2:
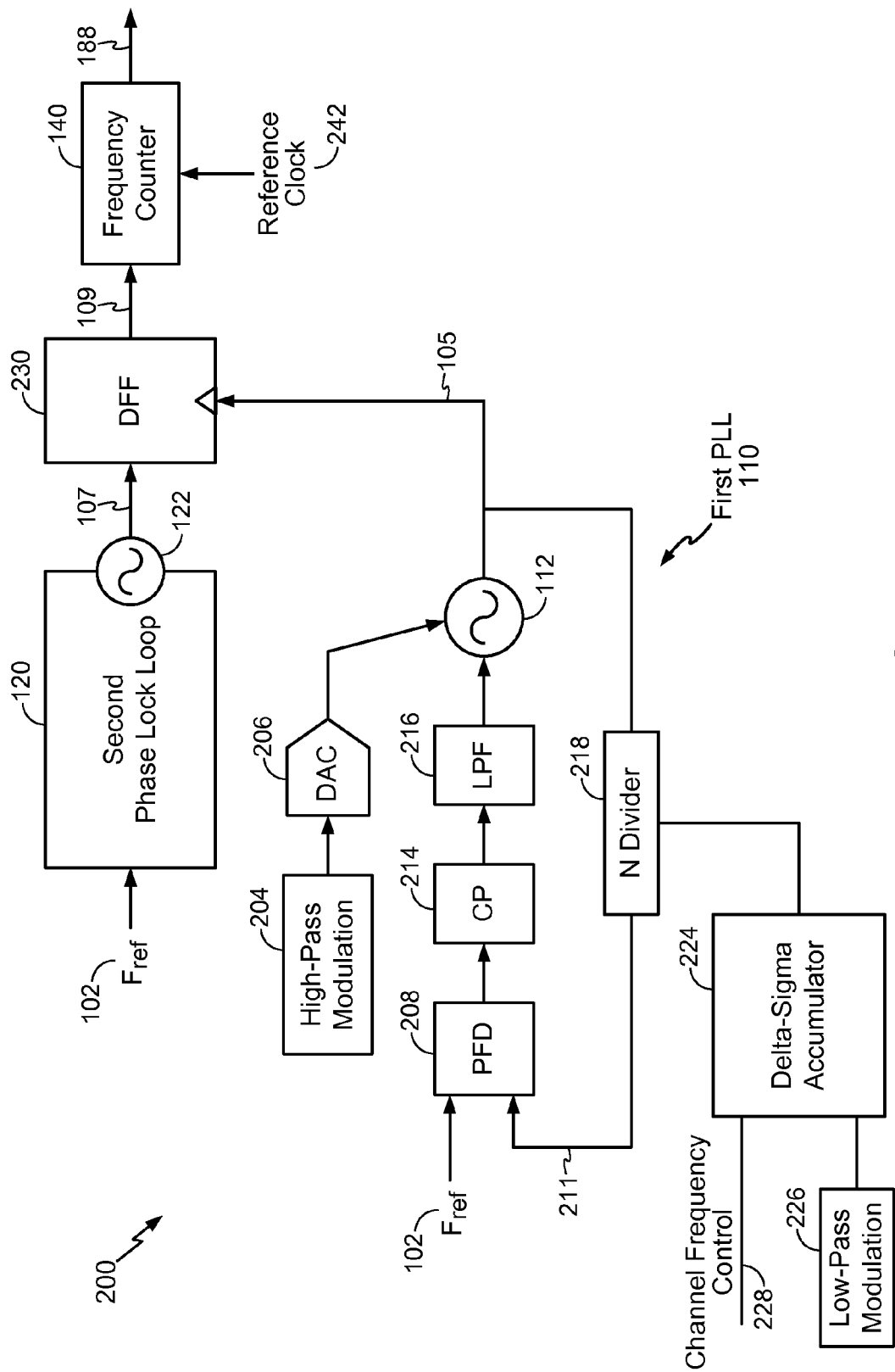
FIG. 2 is a block diagram of another particular illustrative embodiment of a system operable to determine a gain of an oscillator.

Referring to FIG. 2, a particular illustrative embodiment of a system 200 operable to determine a gain of an oscillator is shown. The system 200 includes the first PLL 110, the first VCO 112, the second PLL 120, the second VCO 122, and the frequency counter 140. The system 200 further includes a D-type flip-flop (DFF) 230. The DFF 230 may be within the down-conversion circuit 130 of FIG. 1.

The first PLL 110 may include a phase frequency detector (PFD) 208, a charge pump (CP) 214, a low pass filter (LPF) 216, the first VCO 112, and a divider 218. The reference signal 102 having the reference frequency ($F_{ref}$) is received at a first input of the phase frequency detector 208 and a feedback signal 211 of the first PLL 110 is received at a second input of the phase frequency detector 208. The phase frequency detector 208 is configured to provide a signal to the charge pump 214 based on a phase difference between the reference signal 102 and the feedback signal 211. The charge pump 214 is configured to provide a tuning voltage to the low pass filter 216. The low pass filter 216 is configured to filter out high frequency components of the tuning voltage to generate a filtered tuning voltage. The low pass filter 216 provides the filtered tuning voltage to the first VCO 112.

A high-pass modulation circuit 204 is configured to provide digital modulation data to a digital-to-analog converter (DAC) 206. The DAC 206 is configured to convert the digital modulation data to an analog signal (e.g., a voltage) that is provided to the first VCO 112. A low-pass modulation circuit 226 is configured to provide digital modulation data to a delta-sigma accumulator 224. The delta-sigma accumulator 224 is configured to receive a channel frequency control signal 228 along with the digital modulation data provided by the low-pass modulation circuit 226 and generate an analog signal to provide to the divider 218. The first VCO 112 is configured to provide the VCO output signal 105 having the VCO frequency ($F_{VCO}$) to the divider 218 of the first PLL 110 and to a clock input of the DFF 230.

The second PLL 120 is configured to receive the reference signal 102 having the reference frequency ($F_{ref}$). The second VCO 122 is configured to provide the second VCO output signal 107 having the second frequency ($F_2$) to a data input of the DFF 230.

The DFF 230 is configured to receive the VCO output signal 105 at the clock input and the second VCO output signal 107 at the data input. The DFF 230 is further configured to generate the delta frequency signal 109 in response to receiving the VCO output signal 105 and the second VCO output signal 107.

The delta frequency signal 109 may correspond to a difference between the VCO frequency ($F_{VCO}$) of the VCO output signal 105 and the second frequency ($F_2$) of the second VCO output signal 107. For example, the VCO output signal 105 having the VCO frequency ($F_{VCO}$) is received at the clock input of the DFF 230 and the second VCO output signal 107 having the second frequency ($F_2$) is received at the data input of the DFF 230. In a particular embodiment, on every high-edge clock pulse at the clock input (responsive to the VCO output signal 105), the DFF 230 samples the second VCO output signal 107. The DFF 230 transfers a sampled digital voltage level of the second VCO output signal 107 to an output of the DFF 230 until the next high-edge clock pulse at the clock input. If the VCO frequency ($F_{VCO}$) of the VCO output signal 105 matches the second frequency ($F_2$) of the second VCO output signal 107, the data input of the DFF 230 will be constant at each high-edge clock pulse which may result in the output of the DFF 230 producing a signal (e.g., the delta frequency signal 109) with zero pulses. The signal produced at the output of the DFF 230 may have zero pulses because an input of the DFF 230 is provided to an output of the DFF 230 on every high-edge clock pulse (i.e., when the DFF 230 is enabled). If the data input of the DFF 230 samples the same digital voltage level each time the DFF 230 is enabled, the output of the DFF 230 will be the same (i.e., no change resulting in a pulse) due to the nature of the DFF 230. Alternatively, if the VCO frequency ($F_{VCO}$) of the VCO output signal 105 does not match the second frequency ($F_2$) of the second VCO output signal 107, the output of the DFF 230 may produce a signal with a frequency corresponding to the difference (i.e., $F_{VCO}-F_2$) of the VCO frequency ($F_{VCO}$) and the second frequency ($F_2$) or proportional to the difference of the VCO frequency ($F_{VCO}$) and the second frequency ($F_2$).

The frequency counter 140 is coupled to receive the delta frequency signal 109 at a first counter input and to receive a reference clock signal 242 at a second counter input. The delta frequency signal 109 may be received at a count enable input of the frequency counter 140 and the reference clock signal 242 may be received at a signal input of the frequency counter 140. The frequency counter 140 is configured to generate a counter output signal 188 that is proportional to the difference between the VCO frequency ($F_{VCO}$) and the second frequency ($F_2$). The counter output signal 188 corresponds to a number of cycles of the reference clock signal 242 that occurs within an enabling portion (e.g., a half-period) of the delta frequency signal 109. The enabling portion of the delta frequency signal 109 corresponds to a count enable time of the frequency counter 140 (e.g., a time interval within a period of the delta frequency signal 109 when the delta frequency signal 109 enables the frequency counter 140). For example, when the enabling portion of the delta frequency signal 109 decreases, a count enable time decreases which may correspond to a rising gain of the first VCO 112. As a result, a number of cycles of the reference clock signal 242 counted during the count enable time decreases. Alternatively, when the enabling portion of the delta frequency signal 109 increases, the count enable time increases. As a result, a number of cycles of the reference clock signal 242 counted during the count enable time increases which may correspond to a decreasing gain of the first VCO 112.

During operation, the system 100 may undergo an initialization process. For example, the first PLL 110 receives the reference signal 102 having the reference frequency ($F_{ref}$) and the first VCO 112 outputs the VCO output signal 105 having an initial frequency ($F_{int}$). The second PLL 120 receives the reference signal 102 having the reference frequency ($F_{ref}$) and the second VCO 122 outputs the second output signal 107 having the second frequency ($F_2$). The down-conversion circuit 130 receives the VCO output signal 105 having the initial frequency ($F_{int}$) and receives the second VCO output signal 107. The down-conversion circuit 130 generates a signal (e.g., the delta frequency signal 109) based on the difference between the initial frequency ($F_{int}$) of the VCO output signal 105 and the second frequency ($F_2$) of the second VCO output signal 107. The frequency counter 140 generates the counter output signal 188 in response to receiving the delta frequency signal 109.

After the initialization process, a change may be applied to the first VCO 112 which may change the frequency of the first VCO output signal 112. For example, the high-pass modulation circuit 204 may provide digital modulation data to the DAC 206, the digital modulation data representing an offset voltage. The DAC 206 converts the digital modulation data to an analog voltage signal and applies the analog voltage signal to the first VCO 112, which changes the frequency of the VCO output signal 105 from the initial frequency ($F_{int}$) to the first frequency ($F_1$). The VCO output signal 105 is provided to the down-conversion circuit 130 and the down-conversion circuit 130 generates the delta frequency signal 109 based on the difference between the first frequency ($F_1$) of the VCO output signal 105 and the second frequency ($F_2$) of the second VCO output signal 107 (e.g., $F_1$–$F_2$). The frequency counter 140 generates the counter output signal 188 in response to receiving the modified delta frequency signal 109.

In a particular embodiment, an automatic gain controller (AGC) circuit (not shown) determines the gain of the first VCO 112 based on the counter output signal 188 from the initialization process and the counter output signal 188 corresponding to the modified delta frequency signal 109. The gain of the first VCO 112 corresponds to a difference between the first frequency ($F_1$) and the initial frequency ($F_{int}$) divided by the change in voltage applied to the first VCO 112 by the analog voltage signal from the DAC 206. For example, a counter output signal 188 from the initialization process may correspond to initial frequency ($F_{int}$) as compared to the second frequency ($F_2$), and the counter output signal 188 corresponding to the modified delta frequency signal 109 may correspond to the first frequency ($F_1$) as compared to the second frequency ($F_2$). The AGC circuit may compare the two counter output signals 188 to determine a change in frequency of the first VCO 112. The AGC circuit may determine the gain of the first VCO 112 by dividing the change in frequency by the change in voltage applied to the first VCO 112.

A gain determination operation of the first VCO 112 may be performed using a closed loop initialization process or an open loop initialization process. An example of the closed loop initialization process is illustrated with respect to FIGS. 3-6. An example of the open loop initialization process is illustrated with respect to FIGS. 7-9.

Figure 3:
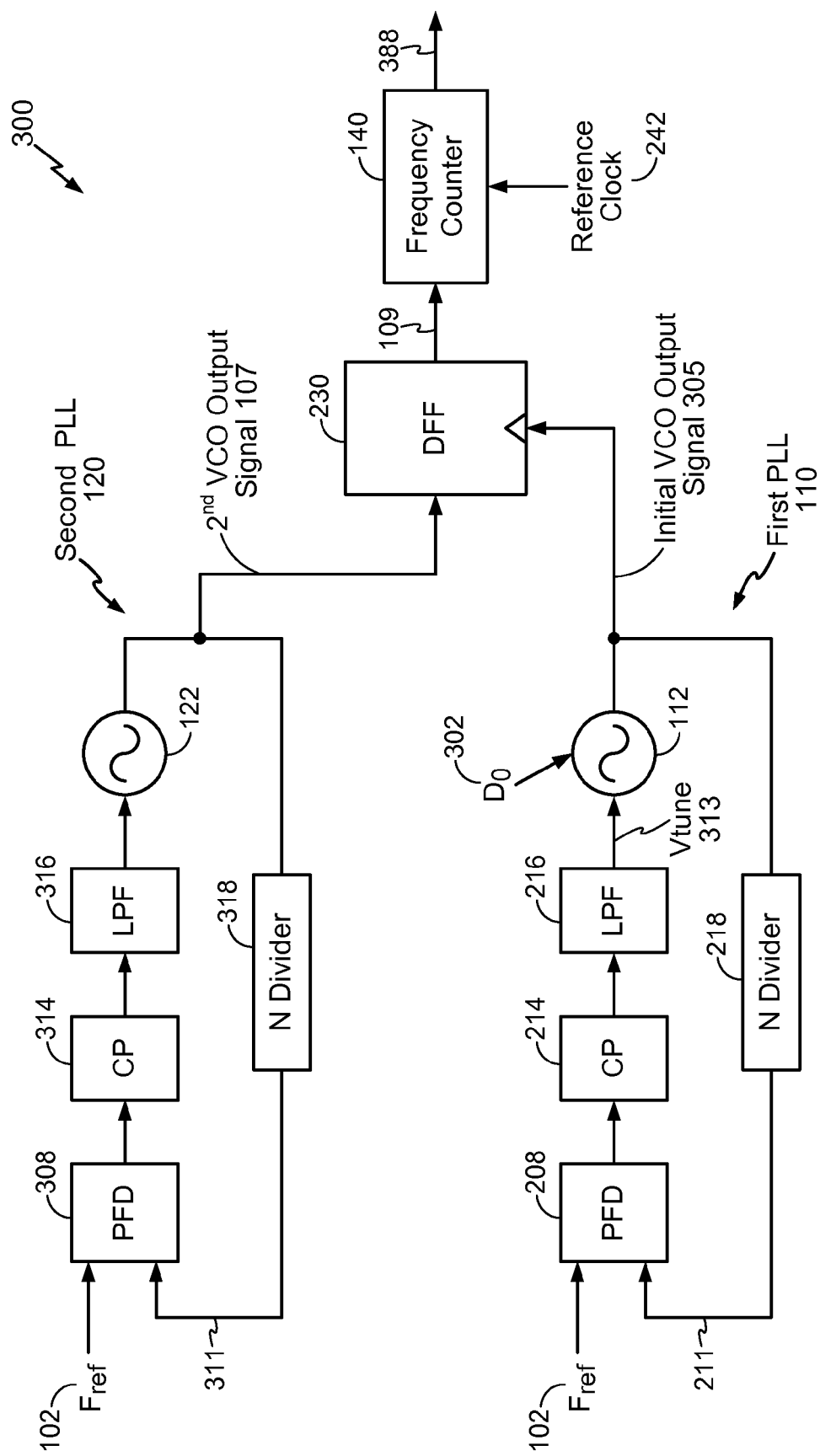
FIG. 3 is a block diagram illustrating a particular stage of a system that is operable to determine a gain of an oscillator using a closed loop initialization.

Referring to FIG. 3, a particular illustrative embodiment of a system 300 that is operable to determine a gain of an oscillator using a closed loop initialization is shown. The system 300 illustrates a particular stage of a gain determination operation. The system 300 includes the first PLL 110, the first VCO 112, the second PLL 120, the second VCO 122, the DFF 230, and the frequency counter 140.

The second PLL 120 may include a second phase frequency detector (PFD) 308, a second charge pump (CP) 314, a second low pass filter (LPF) 316, the second VCO 122, and a second divider 318. The reference signal 102 having the reference frequency ($F_{ref}$) is received at a first input of the second phase frequency detector 308 and a feedback signal 311 of the second PLL 120 is received at a second input of the second phase frequency detector 308. The second phase frequency detector 308 is configured to provide a signal to the second charge pump 314 based on a phase difference between the reference signal 102 and the feedback signal 311. The second charge pump 314 is configured to provide a tuning voltage to the second low pass filter 316. The second low pass filter 316 is configured to filter out high frequency components of the tuning voltage to generate a filtered tuning voltage. The second low pass filter 316 provides the filtered tuning voltage to the second VCO 122.

During operation, the system 300 may undergo a closed loop initialization process. During the closed loop initialization process, the phase frequency detector 208 receives the reference signal 102 having the reference frequency ($F_{ref}$) and receives the feedback signal 211 from the divider 218. The phase frequency detector 208 provides a signal to the charge pump 214 based on a phase difference between the reference signal 102 and the feedback signal 211. The charge pump 214 provides a tuning voltage to the low pass filter 216 and the low pass filter 216 filters out high frequency components of the tuning voltage to generate a tuning voltage (Vtune) 313. The low pass filter 216 provides the filtered tuning voltage (Vtune) 313 to the first VCO 112.

An initial voltage ($D_0$) 302 is applied to the first VCO 112. For example, the high-pass modulation circuit 204 of FIG. 2 may provide digital modulation data to the DAC 206 of FIG. 2. The DAC 206 may convert the digital modulation data to an analog voltage signal (i.e., the initial voltage ($D_0$) 302) and provide the analog voltage signal to the first VCO 112. In response to receiving the initial voltage ($D_0$) 302 and the filtered tuning voltage (Vtune) 313, the first VCO 112 may be coarsely locked to an initial frequency ($F_{int}$). The first VCO 112 may generate an initial VCO output signal 305 having the initial frequency ($F_{int}$) in response to being coarsely locked to the initial frequency ($F_{int}$). In a particular embodiment, the initial frequency ($F_{int}$) may be equal to or approximately equal to the reference frequency ($F_{ref}$). For example, the initial frequency ($F_{int}$) may be within 1 ppm of the reference frequency ($F_{ref}$). The initial VCO output signal 305 may correspond to the VCO output signal 105 of FIG. 1. The first VCO 112 provides the initial VCO output signal 305 having the initial frequency ($F_{int}$) to the clock input of the DFF 230 and to the divider 218 of the first PLL 110.

The second phase frequency detector 308 receives the reference signal 102 having the reference frequency ($F_{ref}$) and receives the feedback signal 311 from the second divider 318. The second phase frequency detector 308 provides a signal to the second charge pump 314 based on a phase difference between the reference signal 102 and the feedback signal 311. The second charge pump 314 provides a tuning voltage to the second low pass filter 316 and the second low pass filter 316 filters out high frequency components of the tuning voltage to generate a filtered tuning voltage. The low pass filter 316 provides the filtered tuning voltage to the second VCO 122.

In response to receiving the filtered tuning voltage, the second VCO 122 may be coarsely locked to the second frequency ($F_2$). The second VCO 122 generates the second VCO output signal 107 having the second frequency ($F_2$) in response to being coarsely locked to the second frequency ($F_2$). In a particular embodiment, the second frequency ($F_2$) may be equal to or approximately equal to the reference frequency ($F_{ref}$). The second VCO 122 may provide the second VCO output signal 107 to the data input of the DFF 230 and to the second divider 318 of the second PLL 120. In a particular embodiment, the second frequency ($F_2$) may be equal to or approximately equal to the initial frequency ($F_{int}$). For example, the initial frequency ($F_{int}$) may be within 1 part per million (ppm) of the reference frequency ($F_{ref}$) and of the second frequency ($F_2$).

The DFF 230 generates the delta frequency signal 109 based on a difference between the initial frequency ($F_{int}$) of the initial VCO output signal 305 and the second frequency ($F_2$) of the second VCO output signal 107. The DFF 230 provides the delta frequency signal 109 to the count enable input of the frequency counter 140. The frequency counter 140 generates a counter output signal 388 that is proportional to the difference between the initial frequency ($F_{int}$) and the second frequency ($F_2$). The enabling portion (or half-period) of the delta frequency signal 109 corresponds to a count enable time of the frequency counter 140.

Coarsely locking the first VCO 112 to an initial frequency within 1 ppm of the reference frequency ($F_{ref}$) and the second frequency ($F_2$) reduces lock time of the first PLL 110 and the second PLL 120 as compared to completing a fine locking operation that achieves a more accurate lock. The counter output signal 388 provides a baseline value that may be used for comparison to other values generated as a result of varying the voltage (e.g., voltage other than $D_0$ 302) provided to the first VCO 112, as described in FIGS. 4-6.

Figure 4:
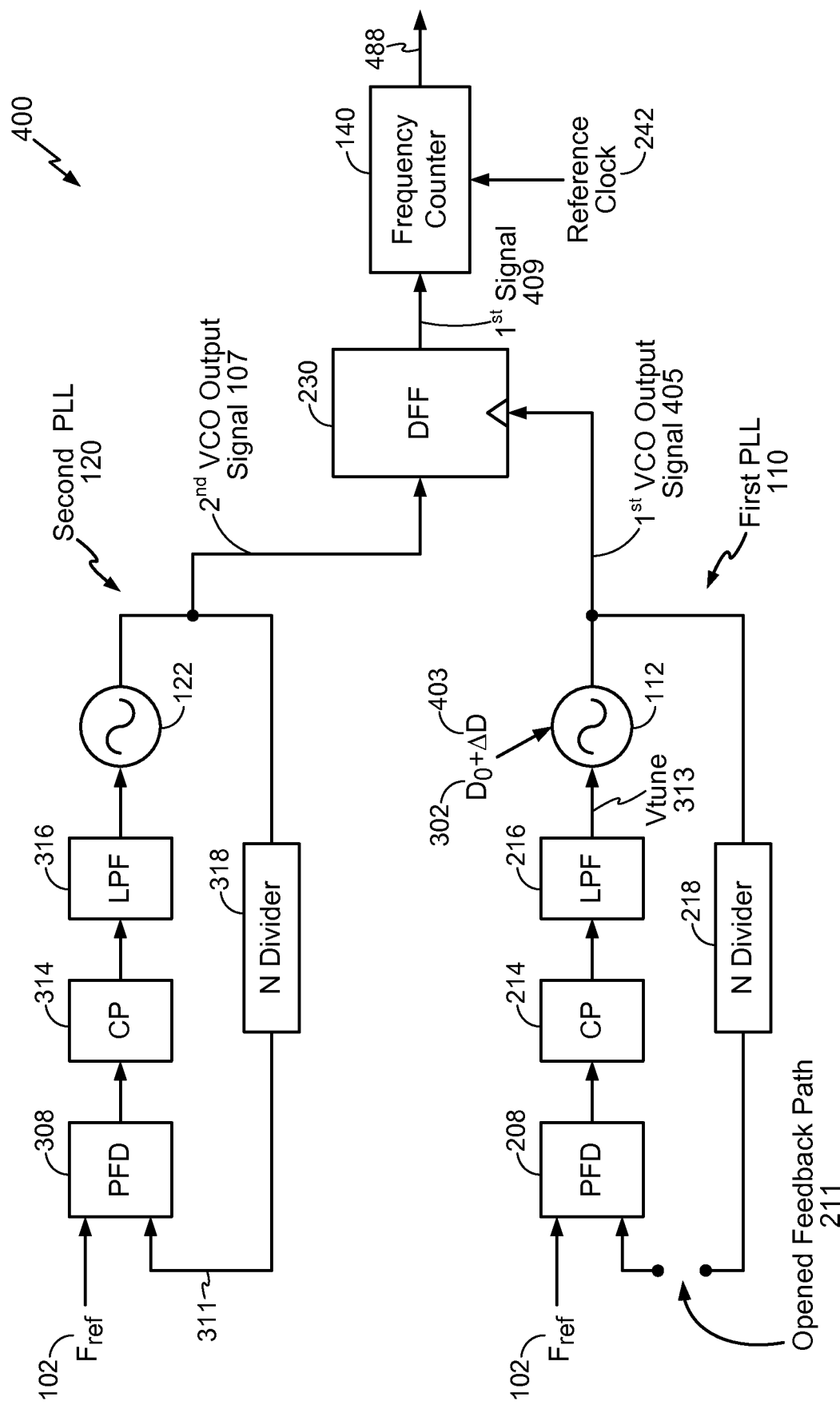
FIG. 4 is a block diagram illustrating another stage of the system of FIG. 3.

Referring to FIG. 4, a block diagram of a system 400 illustrates another stage of the gain determination operation of the system of FIG. 3. For example, the system 400 illustrates a configuration to determine, after initialization, a first VCO gain based on an offset voltage ($\Delta D$) 403. The system 400 includes the first PLL 110, the first VCO 112, the second PLL 120, the second VCO 122, the DFF 230, and the frequency counter 140.

During operation, the second PLL 120 receives the reference signal 102 having the reference frequency ($F_{ref}$) and provides the second VCO output signal 107 having the second frequency ($F_2$) to the data input of the DFF 230 in a similar manner as described above.

The first PLL 110 is unlocked (i.e., opened) to an open loop configuration. Unlocking the first PLL 110 includes opening the feedback path 211 of the first PLL 110 with respect to the input of the phase frequency detector 208. Opening the feedback path 211 may disable loop feedback to the phase frequency detector 208. Additionally, the initial voltage ($D_o$) 302 applied to first VCO 112 is increased by the offset voltage ($\Delta D$) 403 for a first count time $T_1$. For example, the high-pass modulation circuit 204 of FIG. 2 may provide digital modulation data to the DAC 206 of FIG. 2. The DAC 206 may convert the digital modulation data to an analog voltage signal (i.e., the initial voltage ($D_o$) 302+ the offset voltage ($\Delta D$) 403) and provide the analog voltage signal to the first VCO 112.

In response to increasing the initial voltage ($D_0$) 302 by the offset voltage ($\Delta D$) 403, a frequency of the first VCO 112 changes from the initial frequency ($F_{int}$) to a first frequency ($F_1$). The first VCO 112 generates and provides a first VCO output signal 405 having the first frequency ($F_1$) to the clock input of the DFF 230. The first VCO output signal 405 may correspond to the VCO output signal 105 of FIG. 1.

The DFF 230 generates a first signal 409 based on a frequency difference ($\Delta F_1 = F_1 - F_{ref}$) between the first frequency ($F_1$) of the first VCO 112 and the second frequency ($F_2 \approx F_{ref}$) of the second VCO 122. The first signal 409 may correspond to a first frequency change of the first VCO 112 responsive to the initial voltage ($D_0$) 302 increased by the offset voltage ($\Delta D$) 403. The DFF 230 provides the first signal 109 to the count enable input of the frequency counter 140. The frequency counter 140 counts a number of cycles of the reference clock signal 242 that occurs based on the frequency difference ($\Delta F_1 = F_1 - F_{ref}$) of the first signal 409 and generates a counter output signal 488 based on the count. In a particular embodiment, the frequency counter 140 may count a number of cycles of the reference clock signal 242 for a single enable portion of the frequency counter 140. In an alternate embodiment, the frequency counter 140 may count a number of cycles of the reference clock signal 242 for multiple enable portions of the frequency counter 140. An AGC circuit (not shown) may compute an average number of cycles of the reference clock 242 based on the total number of cycles divided by the total number of enable portions.

A first gain $K_{V_1}$ of the first VCO 112 may be determined based at least partially on the first signal 409. For example, the first gain $K_{V_1}$ may be determined as a change in frequency at the first VCO 112 (i.e., $F_1 - F_{int}$) divided by the change in voltage ($\Delta D$) 403: $K_{V_1} = (\Delta F_1 + F_{ref} - F_{int})/\Delta D$. The first gain $K_{V_1}$ may be determined by an AGC circuit based on comparing the value of the counter output signal 388 of FIG. 3 to the value of the counter output signal 488 of FIG. 4. The first gain $K_{V_1}$ may be determined (or estimated) during a signal path gain transition of a transmitter. For example, the first VCO 112 may be within a transmitter of a mobile phone and the first gain $K_{V_1}$ may be determined during a call at the mobile phone.

Figure 5:
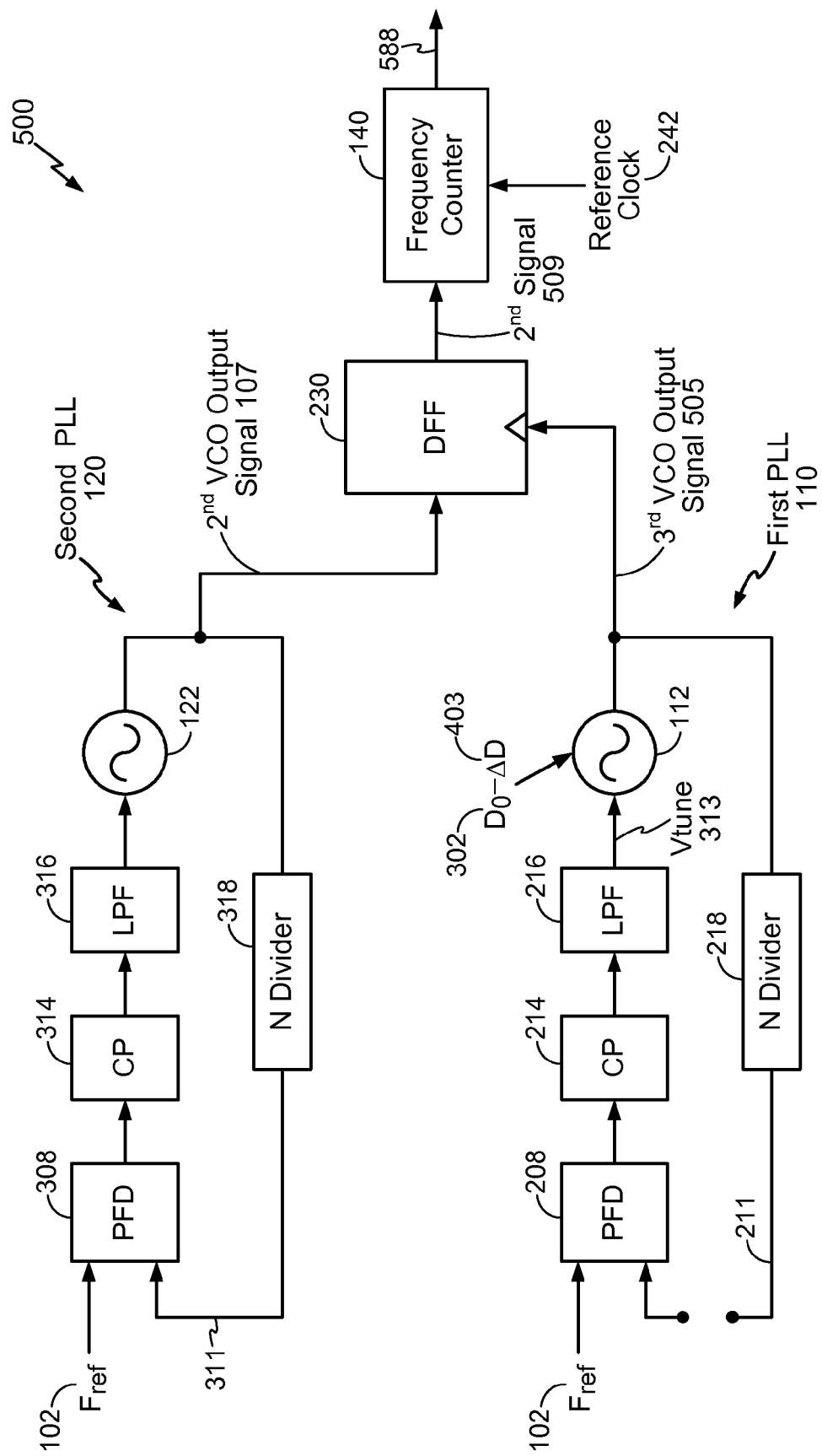
FIG. 5 is a block diagram illustrating another stage of the system of FIG. 3.

Referring to FIG. 5, a block diagram of a system 500 illustrates another stage of the gain determination operation of the system of FIG. 3. For example, the system 500 illustrates a configuration to determine, after initialization, a second VCO gain based on the voltage offset ($\Delta D$) 403. The system 500 includes the first PLL 110, the first VCO 112, the second PLL 120, the second VCO 122, the DFF 230, and the frequency counter 140.

During operation, the second PLL 120 receives the reference signal 102 having the reference frequency ($F_{ref}$) and provides the second VCO output signal 107 having the second frequency ($F_2$) to the data input of the DFF 230 in a similar manner as described above.

The initial voltage ($D_0$) 302 applied to first VCO 112 is decreased by the offset voltage ($\Delta D$) 403 for a second count time $T_2$. In a particular embodiment, the second count time $T_2$ may have a duration that is equal to or approximately equal to a duration of the first count time $T_1$. For example, the high-pass modulation circuit 204 of FIG. 2 may provide digital modulation data to the DAC 206 of FIG. 2. The DAC 206 may convert the digital modulation data to an analog voltage signal (i.e., the initial voltage ($D_0$) 302—the offset voltage ($\Delta D$) 403) and provide the analog voltage signal to the first VCO 112. In response to decreasing the initial voltage ($D_0$) 302 by the offset voltage ($\Delta D$) 403, a frequency of the first VCO 112 changes from the initial frequency ($F_{int}$) to a third frequency ($F_3$). The first VCO 112 generates and provides a third VCO output signal 505 having the third frequency ($F_3$) to the clock input of the DFF 230. The third VCO output signal 505 may correspond to the VCO output signal 105 of FIG. 1.

The DFF 230 generates a second signal 509 based on a frequency difference ($\Delta F_2 = F_3 - F_2$) between the third frequency ($F_3$) of the first VCO 112 and the second frequency ($F_2 \approx F_{ref}$) of the second VCO 122. The second signal 509 may correspond to a second frequency change of the first VCO 112 responsive to the initial voltage ($D_0$) 302 decreased by the offset voltage ($\Delta D$) 403. The DFF 230 provides the second signal 509 to the count enable input of the frequency counter 140. The frequency counter 140 counts a number of cycles of the reference clock signal 242 that occurs based on the frequency difference ($\Delta F_2 = F_3 - F_{ref}$) of the second signal 409 and generates a counter output signal 588 based on the count.

A second gain $K_{V2}$ of the first VCO 112 may be determined based at least partially on the second signal 509. For example, the second gain $K_{V2}$ may be determined as a change in frequency at the first VCO (i.e., $F_3 - F_{int}$) divided by the change in voltage ($\Delta D$) 403: $K_{V2} = (\Delta F_2 + F_{ref} - F_{int})/\Delta D$. The second gain $K_{V2}$ may be determined based on comparing the value of the counter output signal 388 of FIG. 3 to the value of the counter output signal 588 of FIG. 5. A VCO gain of the first VCO 112 may be determined based on the first gain $K_{V1}$ and the second gain $K_{V2}$. For example, the VCO gain of the first VCO 112 may be computed by averaging the first gain $K_{V1}$ and the second gain $K_{V2}$.

It will be appreciated that determining the second gain $K_{V2}$ based on decreasing the initial voltage may reduce or remove a phase accumulation of the first PLL 110 that results from increasing the initial voltage in the stage depicted in FIG. 4. It will also be appreciated that using the second frequency ($F_2$) of the second VCO 122 to determine the second gain may result in a more accurate calibration process with a modest increase in calibration time. For example, multiple gain values of a multipoint calibration may be determined by an AGC circuit within a twenty-five microsecond automatic gain control transition period according to WCDMA protocol.

Figure 6:
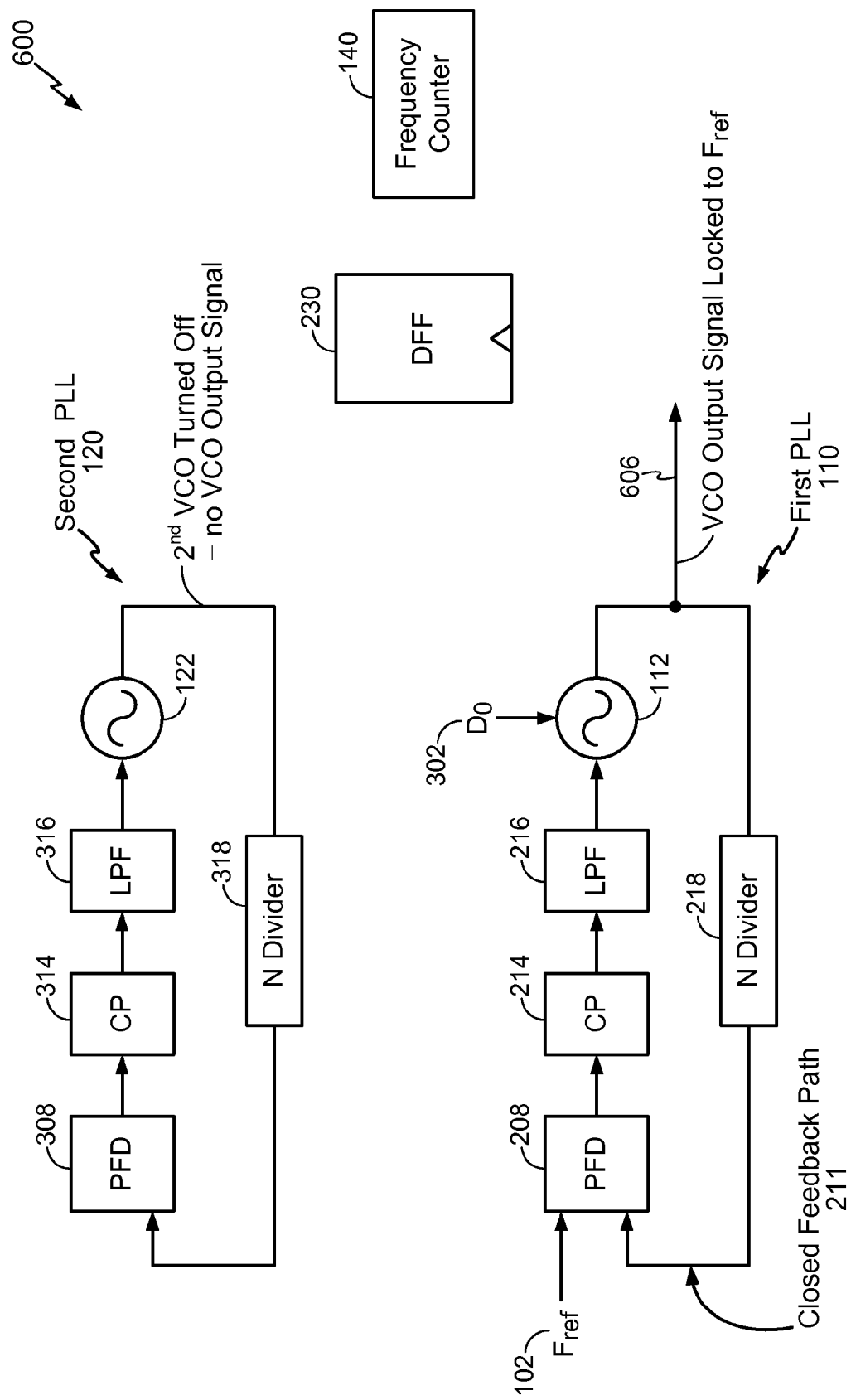
FIG. 6 is a block diagram illustrating another stage of the system of FIG. 3.

Referring to FIG. 6, a block diagram of a system 600 illustrates another stage of the gain determination operation of the system of FIG. 3. For example, the system 600 illustrates a configuration to resume operation after completion of a calibration process. The system 600 includes the first PLL 110, the first VCO 112, the second PLL 120, the second VCO 122, the DFF 230, and the frequency counter 140.

During operation, after the VCO gain of the first VCO 112 is determined, the second PLL 120 may be turned off or re-tasked to resume non-calibration operation. The initial voltage ($D_0$) 302 is provided to the first VCO 112. The feedback path 211 of the first PLL 110 is closed and the first VCO 112 is fine tuned and locked to within 0.1 ppm of the reference frequency ($F_{ref}$). The first VCO 112 generates a VCO output signal 606 locked to the reference frequency ($F_{ref}$).

It will be appreciated that determining the first VCO gain of the first VCO 112 by counting the frequency difference of the first VCO 112 and the second VCO 122 may result in a faster and more accurate calibration process as compared to directly measuring the first frequency ($F_1$) of the first VCO 112. Using a closed loop initialization process and increasing the initial voltage ($D_0$) 302 by the offset voltage ($\Delta D$) 403 for a first count time and decreasing the initial voltage ($D_0$) 302 by the offset voltage ($\Delta D$) 403 for a second count time may result in a reduced accumulated phase difference. As a result, a time necessary to settle the phase difference and relock the first VCO 112 may be reduced. Although FIGS. 3-6 illustrate use of only two gain determinations (e.g., the first gain $K_{V1}$ and the second gain $K_{V2}$) to determine the VCO gain of the first VCO 112, in other embodiments, additional gain determinations using different offset voltages may be used to determine the VCO gain.

Figure 7:
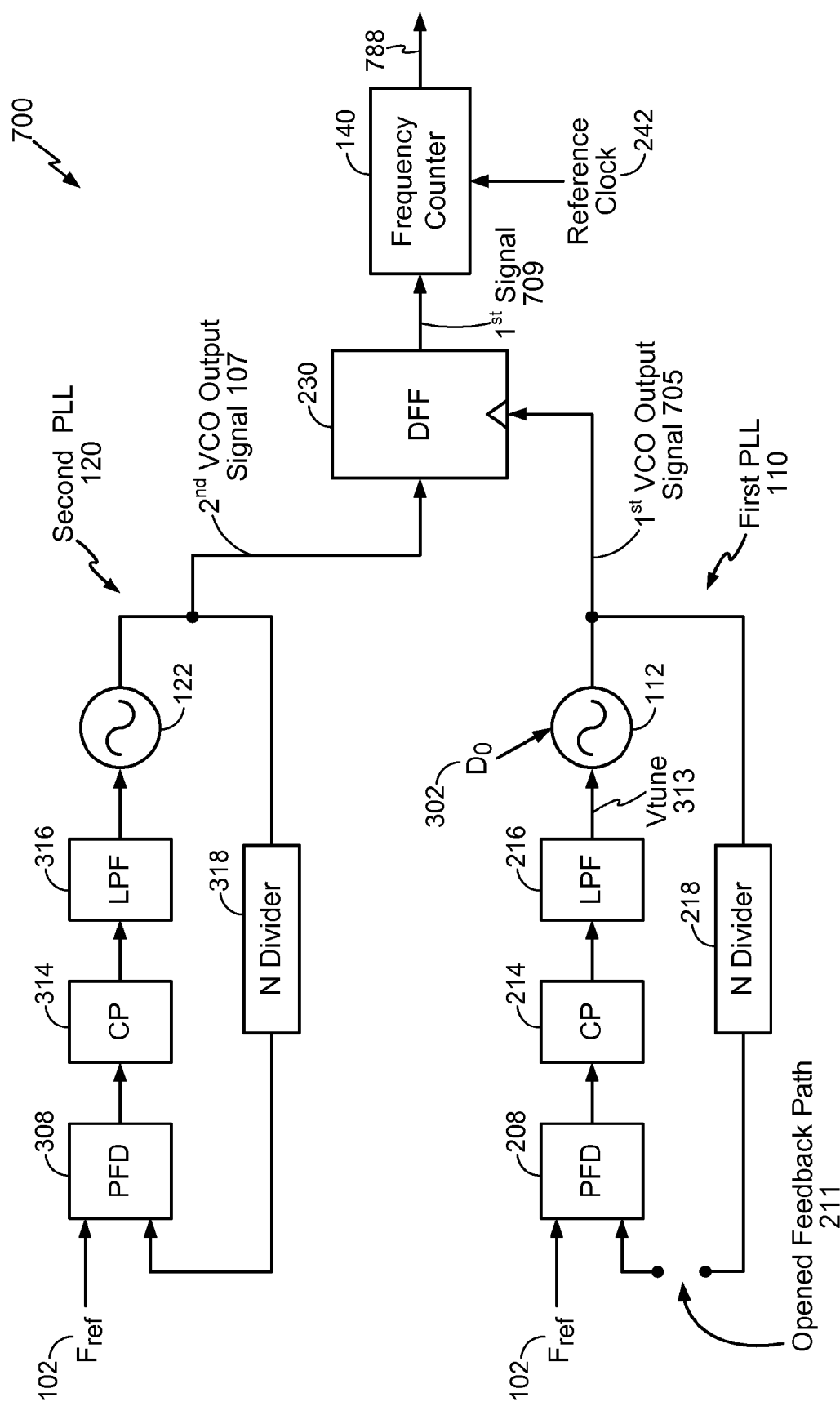
FIG. 7 is a block diagram illustrating a particular stage of a system that is operable to determine a gain of an oscillator using an open loop initialization.

Referring to FIG. 7, a particular illustrative embodiment of a system 700 to determine a gain of an oscillator using an open loop initialization is shown. The system 700 illustrates a particular stage of the gain determination operation. The system 700 includes the first PLL 110, the first VCO 112, the second PLL 120, the second VCO 122, the DFF 230, and the frequency counter 140.

During operation, the system 700 may undergo an open loop initialization process. During the open loop initialization process, the first PLL 110 is unlocked in an open loop configuration. For example, unlocking the first PLL 110 includes opening the feedback path 211 of the first PLL 110 to the input of the phase frequency detector 208. Opening the feedback path 211 may disable loop feedback to the phase frequency detector 208. Additionally, the initial voltage ($D_0$) 302 may be applied to first VCO 112. For example, the high-pass modulation circuit 204 of FIG. 2 may provide digital modulation data to the DAC 206 of FIG. 2. The DAC 206 may convert the digital modulation data to an analog voltage signal (i.e., the initial voltage ($D_0$) 302) and provide the analog voltage signal to the first VCO 112.

A coarse tune and acquisition of the first VCO 112 is performed. The first VCO 112 may be tuned to a first frequency ($F_1$) and may generate a first VCO output signal 705 in response to performance of the coarse tune and acquisition. The first VCO output signal 705 may correspond to the VCO output signal 105 of FIG. 1. The second VCO 122 is coarsely locked to the second frequency ($F_2$) in a similar manner as described above. The second VCO 122 generates the second VCO output signal 107 having the second frequency ($F_2$) in response to coarsely locking the second VCO 122 to the second frequency ($F_2$). The first VCO 112 provides the first VCO output signal 705 to the clock input of the DFF 230 and the second VCO 122 provides the second VCO output signal 107 to the data input of the DFF 230.

The DFF 230 generates a first signal 709 based on a frequency difference ($\Delta F_1 = F_1 - F_2$) between the first frequency ($F_1$) of the first VCO 112 and the second frequency ($F_2 \approx F_{ref}$) of the second VCO 122. The DFF 230 provides the first signal 709 to the count enable input of the frequency counter 140. The frequency counter 140 counts a number of cycles of the reference clock signal 242 that occurs based on the frequency difference ($\Delta F_1 = F_1 - F_2$) of the first signal 709 and generates a counter output signal 788 based on the count.

Figure 8:
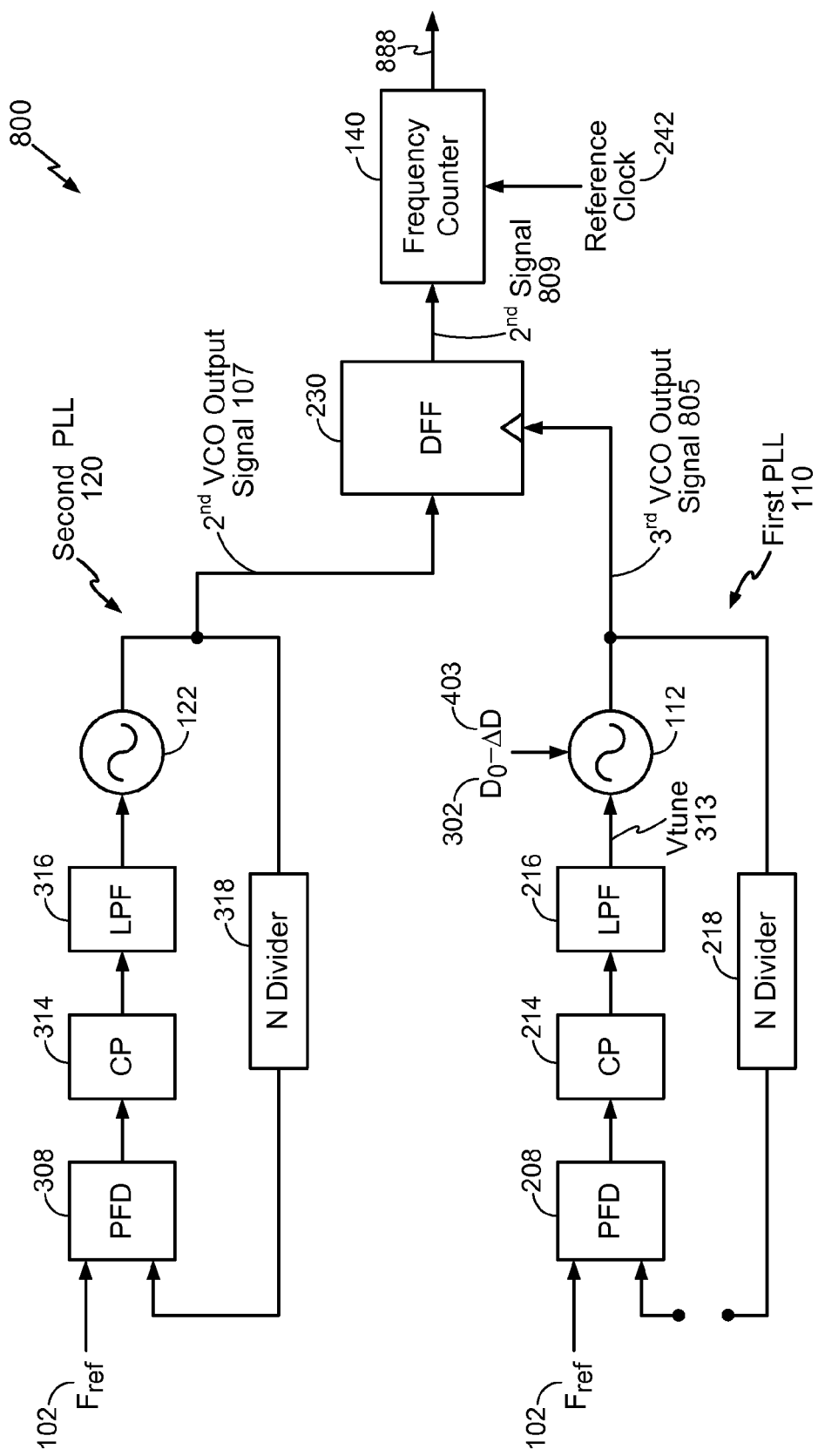
FIG. 8 is a block diagram illustrating another stage of the system of FIG. 7.

Referring to FIG. 8, a block diagram of a system 800 illustrates another stage of the gain determination operation of the system of FIG. 7. For example, the system 800 illustrates a configuration to determine, after initialization, a first VCO gain based on the voltage offset ($\Delta D$) 403. The system 800 includes the first PLL 110, the first VCO 112, the second PLL 120, the second VCO 122, the DFF 230, and the frequency counter 140.

During operation, the second PLL 120 receives the reference signal 102 having the reference frequency ($F_{ref}$) and provides the second VCO output signal 107 having the second frequency ($F_2$) to the data input of the DFF 230 in a similar manner as described above.

The initial voltage ($D_0$) 302 applied to first VCO 112 is decreased by the offset voltage ($\Delta D$) 403. For example, the high-pass modulation circuit 204 of FIG. 2 may provide digital modulation data to the DAC 206 of FIG. 2. The DAC 206 may convert the digital modulation data to an analog voltage signal (i.e., the initial voltage ($D_0$) 302—the offset voltage ($\Delta D$) 403) and provide the analog voltage signal to the first VCO 112. In response to decreasing the initial voltage ($D_0$) 302 by the offset voltage ($\Delta D$) 403, a frequency of the first VCO 112 changes from the first frequency ($F_1$) to a third frequency ($F_3$). The first VCO 112 generates and provides a third VCO output signal 805 having the third frequency ($F_3$) to the clock input of the DFF 230. The third VCO output signal 805 may correspond to the VCO output signal 105 of FIG. 1.

The DFF 230 generates a second signal 809 based on a frequency difference ($\Delta F_2 = F_3 - F_2$) between the third frequency ($F_3$) of the first VCO 112 and the second frequency ($F_2 \approx F_{ref}$) of the second VCO 122. The second signal 809 may correspond to a frequency change of the first VCO 112 responsive to the initial voltage ($D_0$) 302 decreased by the offset voltage ($\Delta D$) 403. The DFF 230 provides the second signal 809 to the count enable input of the frequency counter 140. The frequency counter 140 counts a number of cycles of the reference clock signal 242 that occurs based on the frequency difference ($\Delta F_2 = F_3 - F_2$) of the second signal 809 and generates a counter output signal 888 based on the count.

A first gain $K_{V1}$ of the first VCO 112 may be determined based at least partially on the first signal 709 and the second signal 809. The first gain $K_{V1}$ may be determined by comparing the value of the counter output signal 788 of FIG. 7 to the value of the counter output signal 888 of FIG. 8. For example, the first gain $K_{V1}$ may be determined as a change in frequency at the first VCO (i.e., $F_3 - F_1$) divided by the change in voltage ($\Delta D$) 403: $K_{V1} = (\Delta F_2 - \Delta F_1)/\Delta D$.

Figure 9:
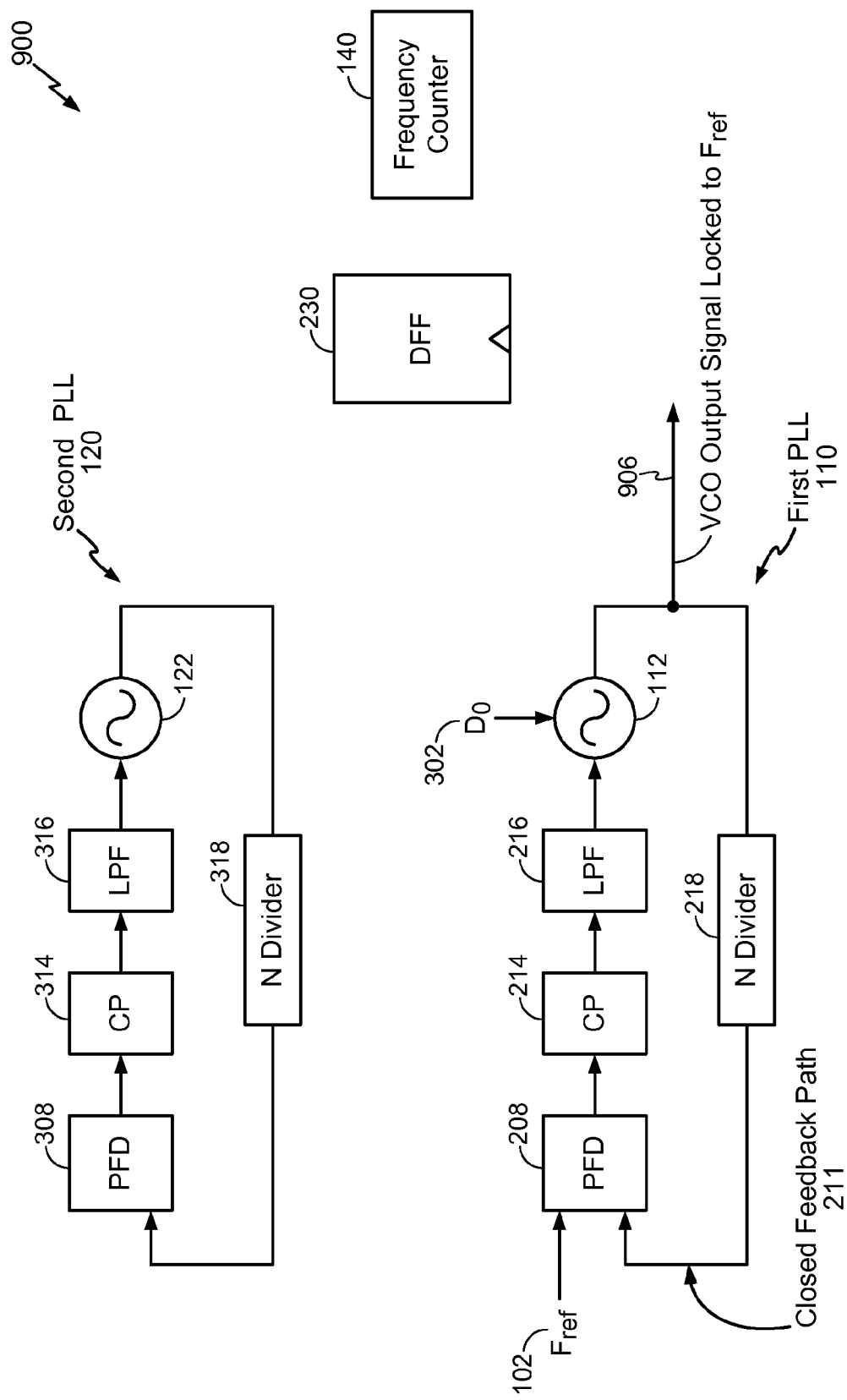
FIG. 9 is a block diagram illustrating another stage of the system of FIG. 7.

Referring to FIG. 9, a block diagram of a system 900 illustrates another stage of the gain determination operation of the system of FIG. 7. For example, the system 900 illustrates a configuration to resume operation after completion of a calibration process. The system 900 includes the first PLL 110, the first VCO 112, the second PLL 120, the second VCO 122, the DFF 230, and the frequency counter 140.

During operation, after the first VCO gain of the first VCO 112 is determined (such as described with respect to FIGS. 7 and 8), the second PLL 112 may be turned off or re-tasked to resume non-calibration operation. The initial voltage ($D_0$) 302 may be provided to the first VCO 112. The feedback path 211 of the first PLL 110 is closed and the first VCO 112 may be fine tuned and locked to within 0.1 ppm of the reference frequency ($F_{ref}$). The first VCO 112 generates a VCO output signal 906 locked to the reference frequency ($F_{ref}$).

It will be appreciated that determining the first VCO gain of the first VCO 112 by counting the frequency difference of the first VCO 112 and the second VCO 122 may result in a faster and more accurate calibration process as compared to directly measuring the first frequency of the first VCO. Using an open loop initialization process and a coarse tune and acquisition may result in a reduced number of offset voltages ($\Delta D$) 403 being applied to the first VCO 112 for a VCO gain determination. As a result, the calibration process may be faster as compared to a closed loop initialization process.

Figure 10:
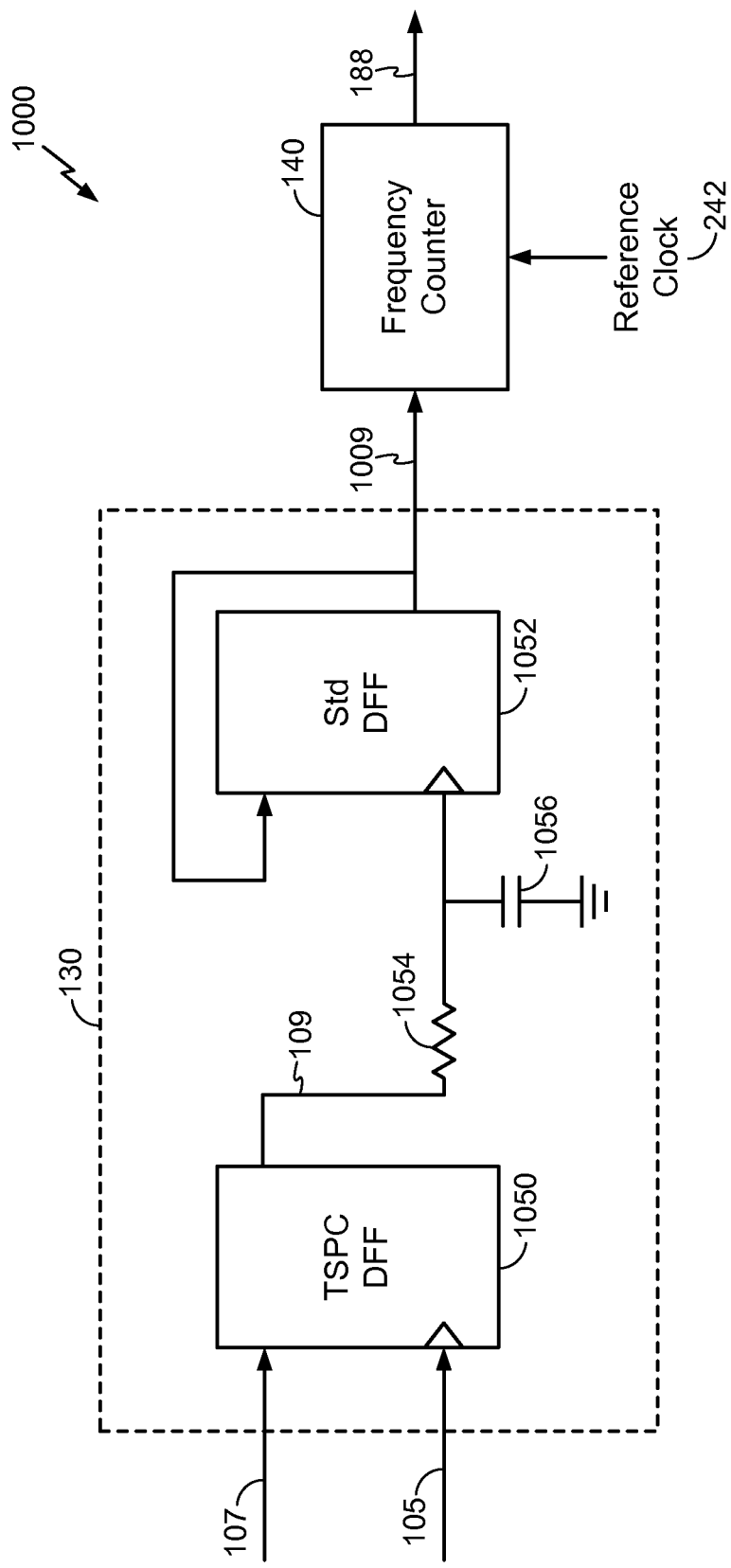
FIG. 10 is a block diagram of a particular illustrative embodiment of a down-conversion circuit of the system of FIG. 1, the circuit including a D-type flip flop (DFF)

Referring to FIG. 10, a particular illustrative embodiment of the down-conversion circuit 130 and the frequency counter 140 that may be used in systems 100-900 of FIGS. 1-9 is shown and generally designated 1000.

The down-conversion circuit 130 includes a true single-phase-clock (TSPC) DFF 1050 and a standard (Std) DFF 1052. An output of the TSPC DFF 1050 is coupled to a clock input of the standard DFF 1052 via a low pass filter. The low pass filter may include a resistor 1054 and a capacitor 1056. An output of the standard DFF 1052 is coupled to the count enable input of the frequency counter 140.

During operation, the TSPC DFF 1050 receives the VCO output signal 105 at a clock input and receives the second VCO output signal 107 at a data input. The TSPC DFF 1050 generates the delta frequency signal 109 based on the frequency difference of the VCO output signal 105 and the second VCO output signal 107. The delta frequency signal 109 may be filtered through the low pass filter and provided to a clock input of the standard DFF 1052.

The standard DFF 1052 receives the filtered delta frequency signal 109 at the clock input. The standard DFF 1052 generates a counter enable signal 1009 (i.e., a down-converted filtered delta frequency signal 109 based on a divide-by-2 ratio) in response to receiving the filtered delta frequency signal 109 at the clock input.

The frequency counter 140 receives the counter enable signal 1009 at the count enable input of the frequency counter 140 and the reference clock signal 242 at a signal input of the frequency counter 140. The frequency counter 140 generates a counter output signal 188 that is proportional to the difference between the VCO frequency ($F_{VCO}$) of the VCO output signal 105 and the second frequency ($F_2$) of the second VCO output signal 107. The counter output signal 188 corresponds to a number of cycles of the reference clock signal 242 that occurs within an enabling portion (i.e., a period, a ½ period, a ¼ period, etc.) of the delta frequency signal 109. The enabling portion of the delta frequency signal 109 may correspond to a count enable time of the frequency counter 140. The frequency counter 140 may be a 7-bit counter, an 8-bit counter, a 9-bit counter, or any other counter that operates at a relatively low frequency as compared to the VCO output signal 105 and the second VCO output signal 107.

Figure 11:
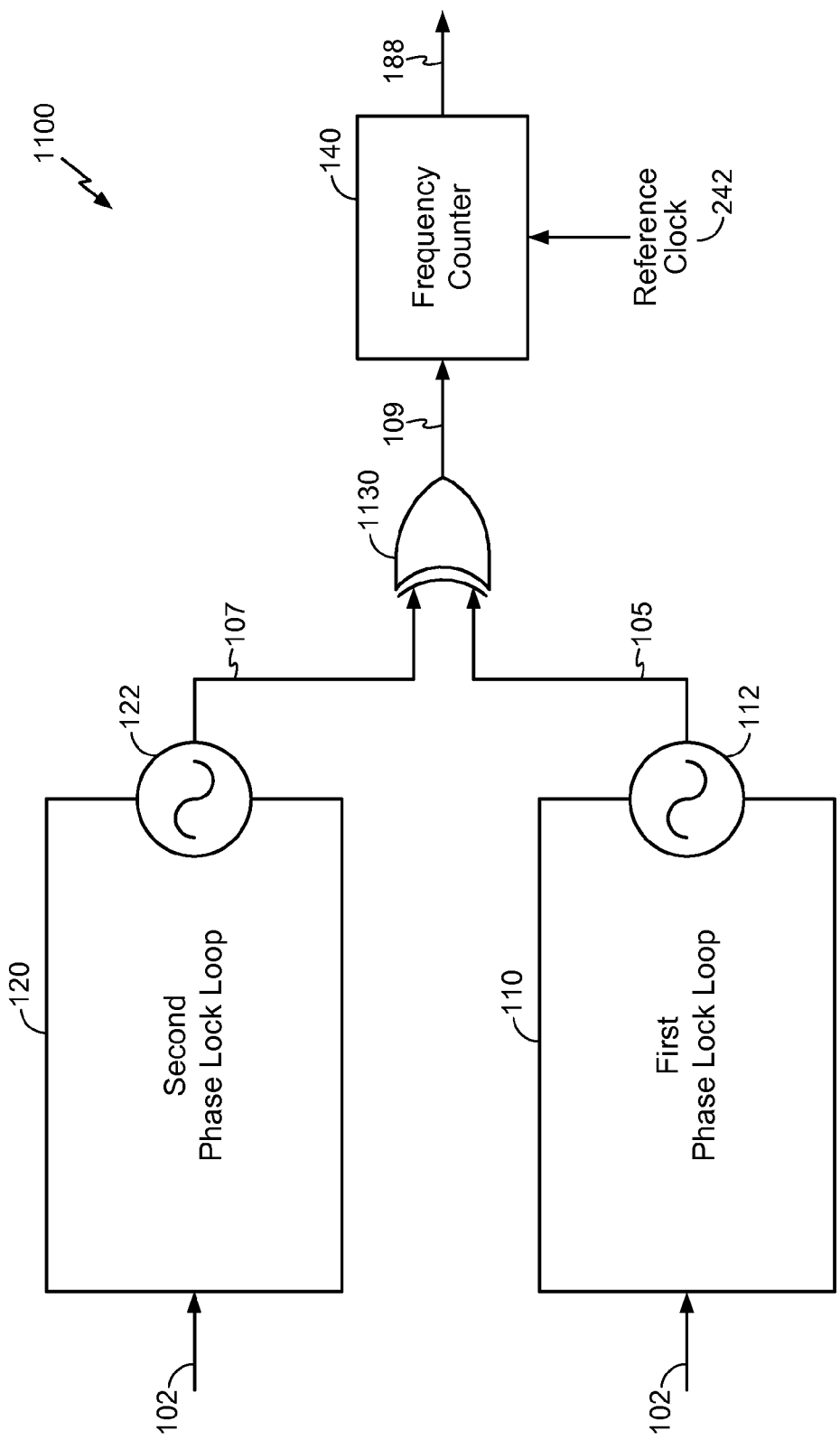
FIG. 11 is a block diagram of another particular illustrative embodiment of the system of FIG. 1 including a logic gate down-conversion circuit.

Referring to FIG. 11, another particular illustrative embodiment of the system of FIG. 1 including a logic gate down-conversion circuit is shown and generally designated 1100. The system 1100 includes the first PLL 110, the first VCO 112, the second PLL 120, the second VCO 122, and the frequency counter 140. The system 1100 further includes an exclusive-or (XOR) gate 1130. The XOR gate 1130 may correspond to the down-conversion circuit 130 of FIG. 1. The output of the first VCO 112 is coupled to a first input of the XOR gate 1130 and the output of the second VCO 122 is coupled to a second input of the XOR gate 1130. An output of the XOR gate 1130 is coupled to the count enable input of the frequency counter 140.

During operation, the VCO output signal 105 is provided to the first input of the XOR gate 1130 and the second VCO output signal 107 is provided to the second input of the XOR gate 1130. If the VCO frequency ($F_{VCO}$) of the VCO output signal 105 matches the second frequency ($F_2$) of the second VCO output signal 107, the output of the XOR gate 1130 may produce a signal (e.g., the delta frequency signal 109) with zero pulses. Alternatively, if the VCO frequency ($F_{VCO}$) of the VCO output signal 105 does not match the second frequency ($F_2$) of the second VCO output signal 107, the output of the XOR gate 1130 may produce a signal with pulses occurring at a frequency proportional to the difference (i.e., $F_{VCO} - F_2$) of the VCO frequency ($F_{VCO}$) and the second frequency ($F_2$). The signal may be produced by generating a logical high output when the VCO output signal 105 and the second VCO output signal 107 correspond to different logic levels and by generating a logical low output when the first VCO output signal 105 and the second VCO signal 107 correspond to similar logic levels.

Figure 12:
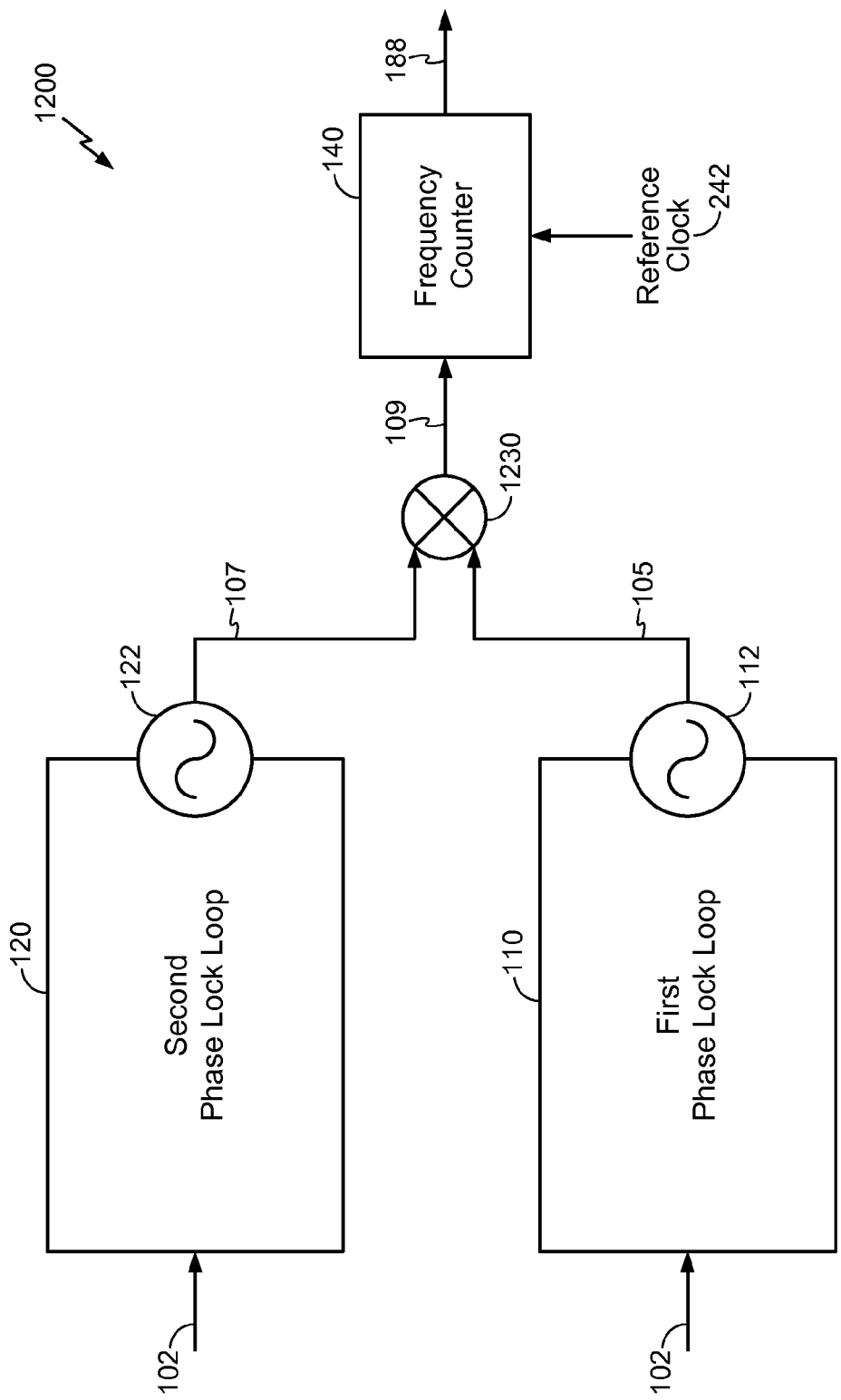
FIG. 12 is a block diagram of another particular illustrative embodiment of the system of FIG. 1 including a mixer down-conversion circuit.

Referring to FIG. 12, another particular illustrative embodiment of the system of FIG. 1 including a mixer down-conversion circuit is shown and generally designated 1200. The system 1200 includes the first PLL 110, the first VCO 112, the second PLL 120, the second VCO 122, and the frequency counter 140. The system 200 further includes a mixer 1230. The mixer 1230 may correspond to the down-conversion circuit 130 of FIG. 1. The output of the first VCO 112 is coupled to a first input of the mixer 1230 and the output of the second VCO 122 is coupled to a second input of the mixer 1230. An output of the mixer 1230 is coupled to the count enable input of the frequency counter 140.

During operation, the VCO output signal 105 is provided to the first input of the mixer 1230 and the second VCO output signal 107 is provided to the second input of the mixer 1230. The output of the mixer 1230 may produce a signal 109 with a frequency that corresponds to the absolute value of a difference between the VCO frequency ($F_{VCO}$) and the second frequency ($F_2$) (i.e., $|F_{VCO}-F_2|$). If the VCO frequency ($F_{VCO}$) and the second frequency ($F_2$) are similar (and the VCO output signal 105 and the second VCO output signal 107 have a similar phase), the signal 109 may be substantially constant. If the VCO frequency ($F_{VCO}$) and the second frequency ($F_2$) are different, the signal 109 may include pulses at a frequency proportional to the difference (i.e., $F_{VCO}-F_2$) of the VCO frequency ($F_{VCO}$) and the second frequency ($F_2$).

Figure 13:
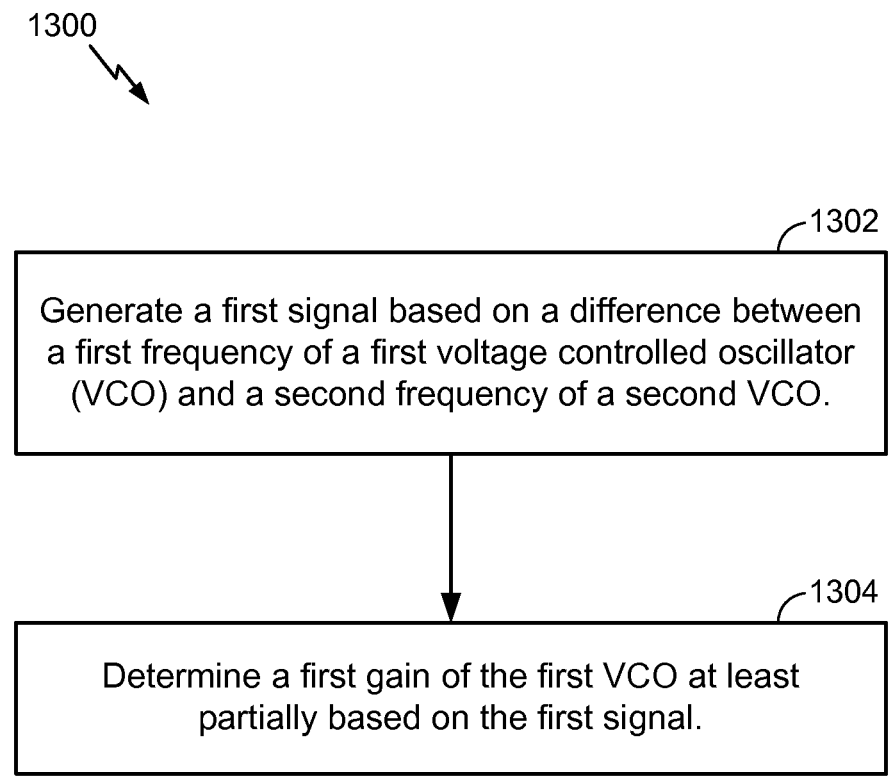
FIG. 13 is a flowchart of a particular embodiment of a method of determining a gain of an oscillator.

Referring to FIG. 13, a particular illustrative embodiment of a method 1300 of determining a gain of an oscillator is shown. In an illustrative embodiment, the method 1300 may be performed by any of the systems depicted in FIGS. 1-12.

The method 1300 includes generating a first signal based on a difference between a first frequency of a first voltage controlled oscillator (VCO) and a second frequency of a second VCO, at 1302. For example, in FIG. 1, the down-conversion circuit 130 may generate the delta frequency signal 109 (e.g., the first signal 409 of FIG. 4) based on a difference between the VCO frequency ($F_{VCO}$) (e.g., the first frequency ($F_1$)) of the first VCO 112 and the second frequency ($F_2$) of the second VCO 122.

A first gain of the first VCO is determined at least partially based on the first signal, at 1304. For example, in the particular embodiment corresponding to a closed loop initialization process, as described with respect to FIGS. 3-6, the frequency counter 140 may count a number of cycles of the reference clock signal 242 during an enabling portion of the delta frequency signal 309 of FIG. 3 and generate the counter output signal 388 based on the count. The frequency counter 140 may also count a number of cycles of the reference clock signal 242 during an enabling portion of the first signal 409 of FIG. 4 and generate the counter output signal 488 based on the count. The difference between the counter output signal 388 of FIG. 3 and the counter output signal 488 of FIG. 4 may be based on an increase to the initial voltage ($D_0$) 302 of the offset voltage ($\Delta D$) 403 that is applied to the first VCO 112 as shown in FIG. 4. The first gain $K_{V1}$ of the first VCO 112 may be determined based at least partially on the first signal 409. For example, the first gain $K_{V1}$ may be determined as a change in frequency at the first VCO (i.e., $F_1-F_{int}$) divided by the change in voltage ($\Delta D$) 403: $K_{V1}=(\Delta F_1+F_{ref}-F_{int})/\Delta D$.

As another example, in the particular embodiment corresponding to an open loop initialization process, as described with respect to FIGS. 7-9, the frequency counter 140 may count a number of cycles of the reference clock signal 242 during an enabling portion of the first frequency signal 709 of FIG. 7 and generate the counter output signal 788 based on the count. The frequency counter 140 may also count a number of cycles of the reference clock signal 242 during an enabling portion of the second signal 809 of FIG. 8 and generate the counter output signal 888 based on the count. The difference between the counter output signal 788 of FIG. 7 and the counter output signal 888 of FIG. 8 may be based on decreasing the initial voltage ($D_0$) 302 applied to the first VCO 112 by the offset voltage ($\Delta D$) 403 as shown in FIG. 8. The first gain $K_{V1}$ of the first VCO 112 may be determined based at least partially on the first signal 709 and the second signal 809. The first gain $K_{V1}$ may be determined by comparing the value of the counter output signal 788 of FIG. 7 to the value of the counter output signal 888 of FIG. 8. For example, the first gain $K_{V1}$ may be determined as a change in frequency at the first VCO (i.e., $F_3-F_1$) divided by the change in voltage ($\Delta D$) 403: $K_{V1}=(\Delta F_2-\Delta F_1)/\Delta D$.

The method 1300 may provide a fast and accurate measurement of a VCO gain that varies based on effects of process, voltage, and/or temperature variations. The first signal may be a signal with a down-converted frequency as compared to the first VCO output signal and the second VCO output signal to enable calibration at a reduced frequency level. The first gain may be determined by counting a number of cycles during an enabling portion of the first signal as opposed to determining a frequency of the first VCO output signal. The first gain may be determined by a closed loop initialization process as described with respect to FIGS. 3-6 or by an open loop initialization process as described with respect to FIGS. 7-9.

Figure 14:
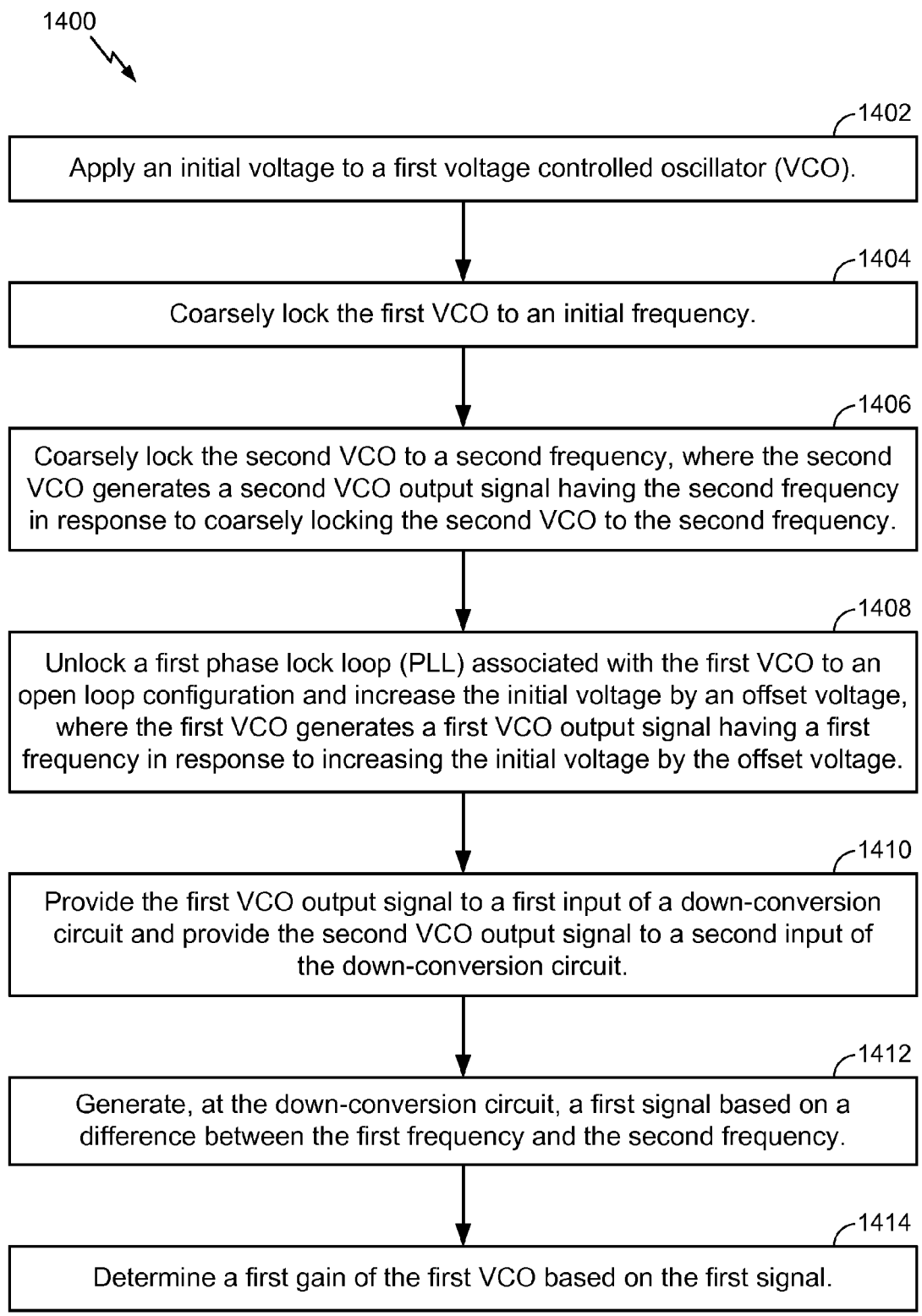
FIG. 14 is a flowchart of a particular embodiment of a method of determining a gain of an oscillator using a closed loop initialization.

Referring to FIG. 14, a particular illustrative embodiment of a method 1400 of determining a gain of an oscillator using a closed loop initialization is shown. In an illustrative embodiment, the method 1400 may be performed by any of the systems 100-500 of FIGS. 1-5.

The method 1400 may include applying an initial voltage to a first voltage controlled oscillator (VCO), at 1402. For example, in FIG. 2, the high-pass modulation circuit 204 may provide digital modulation data to the DAC 206. The DAC 206 may convert the digital modulation data to the initial voltage ($D_0$) 302 and apply the initial voltage ($D_0$) 302 to the first VCO 112. The first VCO may be coarsely locked to an initial frequency, at 1404. For example, in FIG. 3, the first VCO 112 may be coarsely locked to the initial frequency ($F_{int}$).

A second VCO may be coarsely locked to a second frequency, at 1406. For example, in FIG. 3, the second VCO 122 may be coarsely locked to the second frequency ($F_2$). The second VCO 122 may generate a second VCO output signal 107 having the second frequency ($F_2$) in response to coarsely locking the second VCO 122 to the second frequency ($F_2$).

In a particular embodiment, a first phase lock loop (PLL) associated with the first VCO may be unlocked to an open loop configuration and the initial voltage may be increased by an offset voltage, at 1408. For example, in FIG. 4, the first PLL 110 associated with the first VCO 112 may be unlocked to an open loop configuration by opening the feedback path 211 between the divider 218 and the phase frequency detector 208. Further, the high-pass modulation circuit 204 may provide digital modulation data to the DAC 206. The DAC 206 may convert the digital modulation data to increase the initial voltage ($D_0$) 302 by the offset voltage ($\Delta D$) 403 and apply the increased voltage (($D_0$) 302+ ($\Delta D$) 403) to the first VCO 112. The first VCO 112 may generate a first VCO output signal 405 having the first frequency ($F_1$) in response to increasing the initial voltage ($D_0$) 302 by the offset voltage ($\Delta D$) 403.

The first VCO output signal may be provided to a first input of a down-conversion circuit and the second VCO output signal may be provided to a second input of the down-conversion circuit, at 1410. For example, in FIG. 4, the first VCO 112 may provide the first VCO output signal 405 to the clock input of the DFF 230 and the second VCO 122 may provide the second VCO output signal 107 to the data input of the DFF 230.

A first signal may be generated based on a difference between the first frequency and the second frequency at the down-conversion circuit, at 1412. For example, in FIG. 4, the DFF 230 may generate the first signal 409 based on a frequency difference between the first frequency ($F_1$) of the first VCO output signal 405 and the second frequency ($F_2$) of the second VCO output signal 107.

A first gain of the first VCO may be determined based on the first signal, at 1414. For example, the frequency counter 140 may count a number of cycles of the reference clock signal 242 during an enabling portion of the delta frequency signal 309 of FIG. 3 and generate the counter output signal 388 based on the count. The frequency counter 140 may also count a number of cycles of the reference clock signal 242 during an enabling portion of the first signal 409 of FIG. 4 and generate the counter output signal 488 based on the count. The difference between the counter output signal 388 of FIG. 3 and the counter output signal 488 of FIG. 4 may be based on increasing the initial voltage ($D_0$) 302 applied to the first VCO 112 by the offset voltage ($\Delta D$) 403 as shown in FIG. 4. The first gain $K_{V1}$ of the first VCO 112 may be determined based at least partially on the first signal 409. For example, the first gain $K_{V1}$ may be determined as a change in frequency at the first VCO (i.e., $F_1-F_{int}$) divided by the change in voltage ($\Delta D$) 403: $K_{V1}=(\Delta F_1+F_{ref}-F_{int})/\Delta D$.

The method 1400 may provide a fast and accurate measurement of a VCO gain that varies based on effects of process, voltage, and/or temperature variations. It will be appreciated that determining the first VCO gain of the first VCO 112 by counting the frequency difference of the first VCO 112 and the second VCO 122 may result in a faster and more accurate calibration process as compared to directly measuring the first frequency of the first VCO. Using the closed loop initialization process and coarsely locking the first VCO 112 to the initial frequency ($F_{int}$) within 1 ppm of the reference frequency ($F_{ref}$) may save lock time as compared to a fine locking operation that achieves a more accurate lock.

Figure 15:
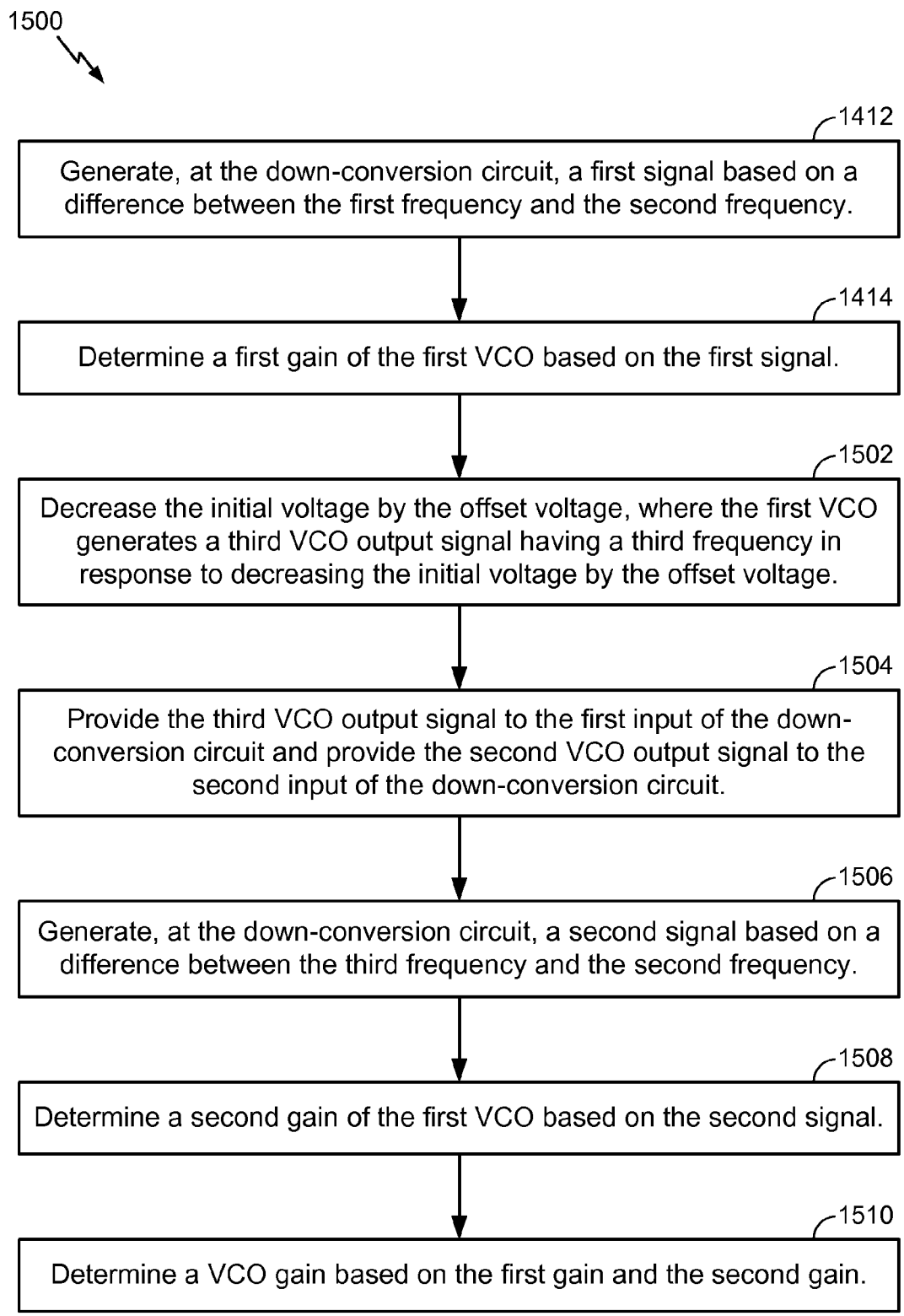
FIG. 15 is a flowchart of another particular embodiment of a method of determining a gain of an oscillator using a closed loop initialization.

Referring to FIG. 15, another particular embodiment of a method 1500 of determining a gain of an oscillator using a closed loop initialization is shown. In an illustrative embodiment, the method 1500 may be performed by the systems 100-500 of FIGS. 1-5.

The method 1500 includes generating a first signal based on a difference between a first frequency and a second frequency at the down-conversion circuit, at 1412. For example, in FIG. 4, the DFF 230 may generate the first signal 409 based on a frequency difference between the first frequency ($F_1$) of the first VCO output signal 405 and the second frequency ($F_2$) of the second VCO output signal 107.

A first gain of the first VCO may be determined based on the first signal, at 1414. For example, in FIG. 4, the frequency counter 140 may count a number of cycles of the reference clock signal 242 during an enabling portion of the first signal 409 to determine the first gain of the first VCO 112. For example, the frequency counter 140 may count a number of cycles of the reference clock signal 242 during an enabling portion of the delta frequency signal 309 of FIG. 3 and generate the counter output signal 388 based on the count. The frequency counter 140 may also count a number of cycles of the reference clock signal 242 during an enabling portion of the first signal 409 of FIG. 4 and generate the counter output signal 488 based on the count. The difference between the counter output signal 388 of FIG. 3 and the counter output signal 488 of FIG. 4 may be based on increasing the initial voltage ($D_0$) 302 applied to the first VCO 112 by the offset voltage ($\Delta D$) 403 as shown in FIG. 4. The first gain $K_{V1}$ of the first VCO 112 may be determined based at least partially on the first signal 409. For example, the first gain $K_{V1}$ may be determined as a change in frequency at the first VCO (i.e., $F_1-F_{int}$) divided by the change in voltage ($\Delta D$) 403: $K_{V1}=(\Delta F_1+F_{ref}-F_{int})/\Delta D$.

In a particular embodiment, the initial voltage may be decreased by an offset voltage, at 1502. For example, the high-pass modulation circuit 204 may provide digital modulation data to the DAC 206. The DAC 206 may convert the digital modulation data to decrease the initial voltage ($D_0$) 302 by the offset voltage ($\Delta D$) 403 and apply the decreased voltage (($D_0$) 302—($\Delta D$) 403) to the first VCO 112. The first VCO 112 may generate the third VCO output signal 505 having the third frequency ($F_3$) in response to decreasing the initial voltage ($D_0$) 302 by the offset voltage ($\Delta D$) 403.

The third VCO output signal may be provided to the first input of the down-conversion circuit and the second VCO output signal may be provided to the second input of the down-conversion circuit, at 1504. For example, in FIG. 5, the first VCO 112 may provide the third VCO output signal 505 to the clock input of the DFF 230 and the second VCO 122 may provide the second VCO output signal 107 to the data input of the DFF 230.

A second signal may be generated based on a difference between the third frequency and the second frequency, at 1506. For example, in FIG. 5, the DFF 230 may generate the second signal 509 based on a frequency difference between the third frequency ($F_3$) of the third VCO output signal 505 and the second frequency ($F_2$) of the second VCO output signal 107.

A second gain of the first VCO may be determined based on the second signal, at 1508. For example, the frequency counter 140 may count a number of cycles of the reference clock signal 242 during an enabling portion of the second signal 509 and generate the counter output signal 588 based on the count. The second gain $K_{V2}$ may be determined as a change in frequency at the first VCO (i.e., $F_3-F_{int}$) divided by the change in voltage ($\Delta D$) 403: $K_{V2}=(\Delta F_2+F_{ref}-F_{int})/\Delta D$.

A VCO gain may be determined based on the first gain and the second gain. For example, the VCO gain may be determined by computing an average (e.g., an arithmetic mean) of the first gain $K_{V1}$ and the second gain $K_{V2}$.

The method 1500 may provide a fast and accurate measurement of a VCO gain that varies based on effects of process, voltage, and/or temperature variations. It will be appreciated that determining the second gain $K_{V2}$ based on decreasing the initial voltage may reduce or remove a phase accumulation of the first PLL 110 that results from increasing the initial voltage in the prior stage depicted in FIG. 4 and described in the method 1400 of FIG. 14. It will also be appreciated that using the second frequency ($F_2$) of the second VCO 122 to determine the second gain may result in a more accurate calibration process with a modest increase in calibration time. For example, multiple gain values of a multipoint calibration may be determined within a twenty-five microsecond automatic gain control (AGC) transition period in compliance with a WCDMA protocol.

Figure 16:
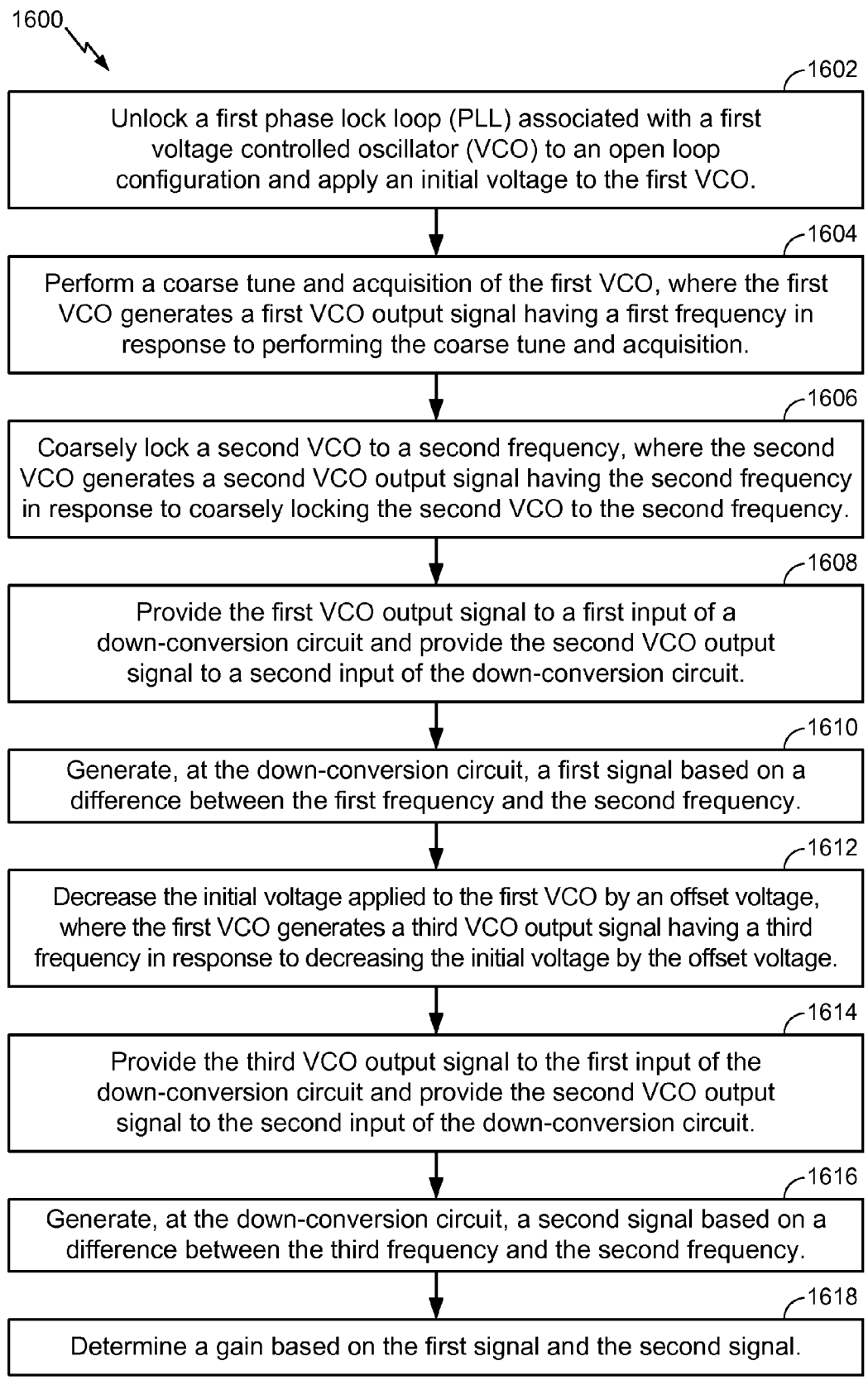
FIG. 16 is a flowchart of a particular embodiment of a method of determining a gain of an oscillator using an open loop initialization.

Referring to FIG. 16, a particular illustrative embodiment of a method 1600 of determining a gain of an oscillator using an open loop initialization is shown. In an illustrative embodiment, the method 1600 may be performed by the system 100 of FIG. 1, the system 200 of FIG. 2, the system 700 of FIG. 7, or the system 800 of FIG. 8.

The method 1600 includes unlocking a first phase lock loop (PLL) associated with a first voltage controlled oscillator (VCO) to an open loop configuration and applying an initial voltage to the first VCO, at 1602. For example, in FIG. 7, the first PLL 110 associated with the first VCO 112 may be unlocked to an open loop configuration by opening the feedback path 211 between the divider 218 and the phase frequency detector 208. Further, the high-pass modulation circuit 204 may provide digital modulation data to the DAC 206. The DAC 206 may convert the digital modulation data to an initial voltage ($D_0$) 302 and apply the initial voltage ($D_0$) 302 to the first VCO 112.

A coarse tune and acquisition of the first VCO may be performed, at 1604. For example, in FIG. 7, a coarse tune and acquisition of the first VCO 112 may be performed. The first VCO 112 may generate the first VCO output signal 705 having the first frequency ($F_1$) in response to performing the coarse tune and acquisition.

A second VCO may be coarsely locked to a second frequency, at 1606. For example, in FIG. 7, the second VCO 122 may be coarsely locked at the second frequency ($F_2$). The second VCO 122 may generate the second VCO output signal 107 having the second frequency ($F_2$) in response to coarsely locking the second VCO 122 to the second frequency ($F_2$). The first VCO output signal may be provided to a first input of a down-conversion circuit and providing the second VCO output signal to a second input of the down-conversion circuit, at 1608. For example, in FIG. 7, the first VCO 112 may provide the first VCO output signal 705 to the clock input of the DFF 230 and the second VCO 122 may provide the second VCO output signal 107 to the data input of the DFF 230.

A first signal may be generated based on a difference between the first frequency and the second frequency, at 1610. For example, in FIG. 7, the DFF 230 may generate the first signal 709 based on a frequency difference between the first frequency ($F_1$) of the first VCO output signal 405 and the second frequency ($F_2$) of the second VCO output signal 107.

The initial voltage applied to the first VCO may be decreased by an offset voltage, at 1612. For example, the high-pass modulation circuit 204 may provide digital modulation data to the DAC 206. The DAC 206 may convert the digital modulation data to decrease the initial voltage ($D_0$) 302 by the offset voltage ($\Delta D$) 403 and apply the decreased voltage (($D_0$) 302—($\Delta D$) 403) to the first VCO 112. The first VCO 112 may generate a third VCO output signal 805 having a third frequency ($F_3$) in response to decreasing the initial voltage ($D_0$) 302 by the offset voltage ($\Delta D$) 403.

The third VCO output signal may be provided to the first input of the down-conversion circuit and the second VCO output signal may be provided to the second input of the down-conversion circuit, at 1614. For example, in FIG. 8, the first VCO 112 may provide the third VCO output signal 805 to the clock input of the DFF 230 and the second VCO 122 may provide the second VCO output signal 107 to the data input of the DFF 230.

A second signal may be generated based on a difference between the third frequency and the second frequency, at 1616. For example, in FIG. 8, the DFF 230 may generate the second signal 809 based on a frequency difference between the third frequency ($F_3$) of the third VCO output signal 805 and the second frequency ($F_2$) of the second VCO output signal 107.

A first gain may be determined based on the first signal and the second signal, at 1618. The first gain $K_{V1}$ may be determined by comparing the counter output signal 788 of FIG. 7 to the counter output signal 888 of FIG. 8. For example, the first gain $K_{V1}$ may be determined as a change in frequency at the first VCO (i.e., $F_3-F_1$) divided by the change in voltage ($\Delta D$) 403: $K_{V1}=(\Delta F_2-\Delta F_1)/\Delta D$.

The method 1600 may provide a fast and accurate measurement of a VCO gain that varies based on effects of process, voltage, and/or temperature variations. It will be appreciated that determining the first VCO gain of the first VCO 112 by counting the frequency difference of the first VCO 112 and the second VCO 122 may result in a faster and more accurate calibration process as compared to directly measuring the first frequency of the first VCO. Using the open loop initialization process and a coarse tune and acquisition may result in a reduced number of offset voltages ($\Delta D$) 403 being applied to the first VCO 112 for a VCO gain determination as compared to the method 1400 of FIG. 14 and the method 1500 of FIG. 15. As a result, the calibration process may be faster as compared to a closed loop initialization process.

Figure 17:
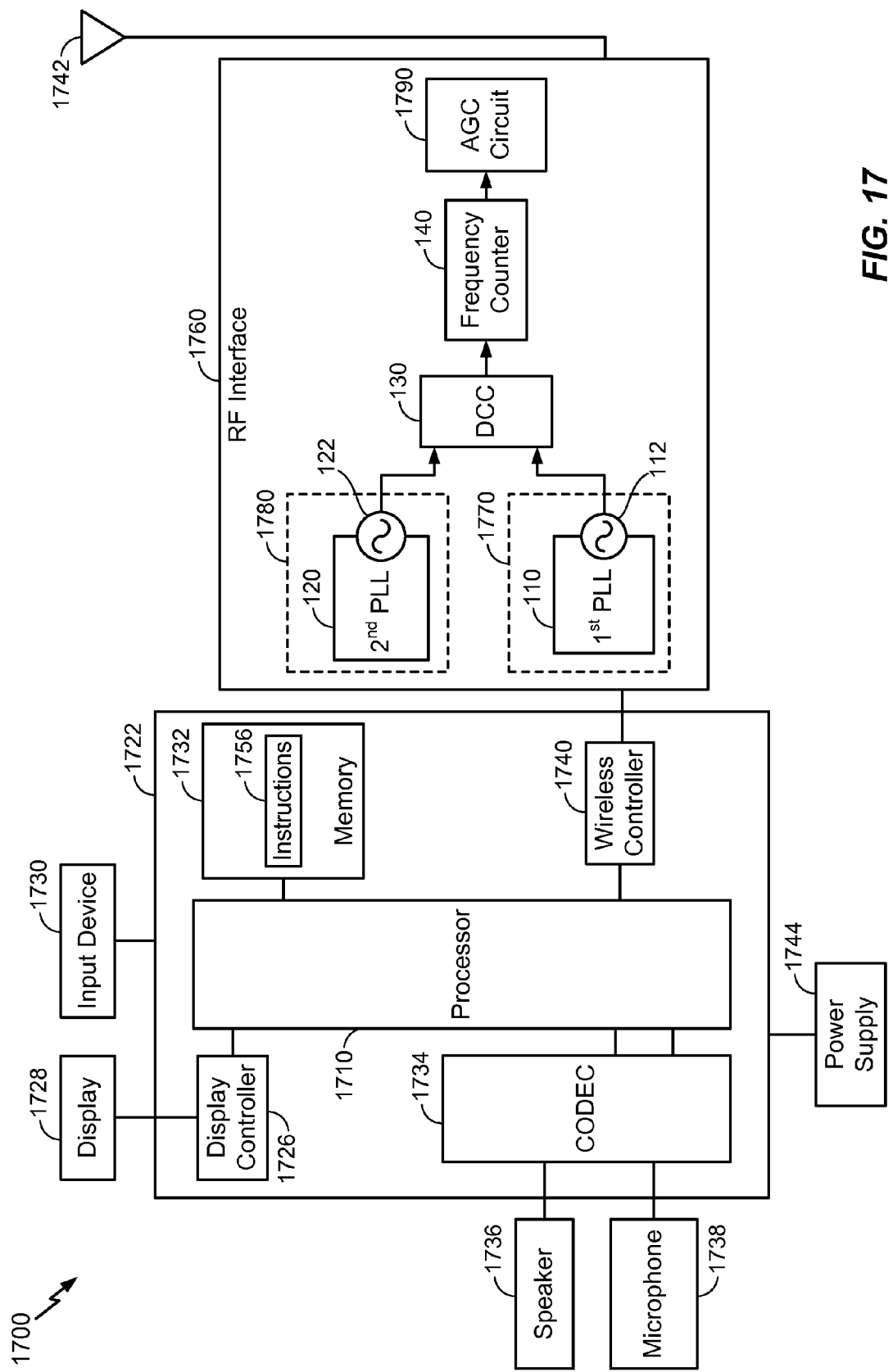
FIG. 17 is a block diagram of a wireless device including a system operable to determine a gain of an oscillator.

Referring to FIG. 17, a block diagram of a particular illustrative embodiment of a wireless communication device is depicted and generally designated 1700. The device 1700 includes a radio-frequency (RF) interface 1760 that is configured to generate a first signal based on a difference between a first frequency of a first VCO and a second frequency of a second VCO. The RF interface 1760 is also configured to determine a first gain of the first VCO at least partially based on the first signal. The first gain may be determined during a call at the wireless communication device 1700. For example, the RF interface 1760 may include the first PLL 110, the first VCO 112, the second PLL 120, the second VCO 122, the down-conversion circuit 130, the frequency counter 140, and an automatic gain controller (AGC) circuit 1790. The first PLL 110 and the first VCO 112 may be included in a transmitter 1770 of the RF interface 1760. The second PLL 120 and the second VCO 122 may be included in a receiver 1780 of the RF interface 1760. The first gain may be determined during an automatic gain control transition of the transmitter 1770. The device 1700 also includes a processor 1710, such as a digital signal processor (DSP), coupled to a memory 1732.

FIG. 17 also shows a display controller 1726 that is coupled to the processor 1710 and to a display 1728. A coder/decoder (CODEC) 1734 can also be coupled to the processor 1710. A speaker 1736 and a microphone 1738 can be coupled to the CODEC 1734. A wireless controller 1740 can be coupled to the processor 1710 and to the RF interface 1760. In a particular embodiment, the radio frequency (RF) interface 1760 may be disposed between the wireless controller 1740 and a wireless antenna 1742.

The memory 1732 may be a tangible non-transitory processor-readable storage medium that includes executable instructions 1756. The instructions 1756 may be executed by a processor, such as the processor 1710, to generate a delta frequency signal (e.g., the first signal 409) based on a difference between a first frequency (e.g., the first frequency ($F_1$)) of a first voltage controlled oscillator (VCO) (e.g., the first VCO 112) and a second frequency (e.g., the second frequency ($F_2$)) of a second VCO (e.g., the second VCO 122). The instructions 1756 may also be executable to determine a first gain (e.g., $K_{V1}$) of the first VCO at least partially based on the first signal. In other embodiments, the executable instructions 1756 may be executable by a processor in the wireless controller 1740 or a processor otherwise coupled to provide control signals and modulation data to the first PLL 110 and the second PLL 120 as described with respect to FIGS. 1-16 and to receive outputs from the frequency counter 140.

In a particular embodiment, the processor 1710, the display controller 1726, the memory 1732, the CODEC 1734, and the wireless controller 1740 are included in a system-in-package or system-on-chip device 1722. In a particular embodiment, an input device 1730 and a power supply 1744 are coupled to the system-on-chip device 1722. Moreover, in a particular embodiment, as illustrated in FIG. 17, the display 1728, the input device 1730, the speaker 1736, the microphone 1738, the wireless antenna 1742, and the power supply 1744 are external to the system-on-chip device 1722. However, each of the display 1728, the input device 1730, the speaker 1736, the microphone 1738, the wireless antenna 1742, and the power supply 1744 can be coupled to a component of the system-on-chip device 1722, such as an interface or a controller.

In conjunction with the described embodiments, an apparatus is disclosed that includes an oscillator and means for generating a first signal based on a difference between a first frequency of a first voltage controlled oscillator (VCO) output signal and a second frequency of a second VCO output signal. For example, the means for generating a first signal based on a difference between a first frequency of a first voltage controlled oscillator (VCO) output signal and a second frequency of a second VCO output signal may include the down-conversion circuit 130 of FIG. 1, the DFF 230 of FIGS. 2-9, the down-conversion circuit 130 of FIG. 10 including the TSPC DFF 1050 and the standard DFF 1052, the XOR gate 1130 of FIG. 11, the mixer 1230 of FIG. 12, the processor 1710 of FIG. 17 configured to execute the instructions 1756 of FIG. 17, one or more other devices, circuits, modules, or processing devices to generate a first signal based on a frequency difference of the first frequency and the second frequency, or any combination thereof.

The apparatus may also include means for receiving the first signal and generating an output that is proportional to the difference between the first frequency and the second frequency. For example, the means for receiving the first signal and generating an output that is proportional to the difference between the first frequency and the second frequency may include the frequency counter 140 of FIGS. 1-12, the processor 1710 of FIG. 17 configured to execute the instructions 1756 of FIG. 17, one or more other devices, circuits, modules, or processing devices to receive the first signal and generate an output that is proportional to the difference between the first frequency and the second frequency, or any combination thereof.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method comprising:
    generating a first signal based on a difference between a first frequency of a first voltage controlled oscillator (VCO) and a second frequency of a second VCO, wherein the first VCO is a separate VCO than the second VCO, and wherein the first VCO generates a first VCO output signal having the first frequency and the second VCO generates a second VCO output signal having the second frequency based on a same reference signal;
    determining a first gain of the first VCO at least partially based on the first signal; and
    unlocking a first phase lock loop (PLL) associated with the first VCO to an open loop configuration, wherein unlocking the first PLL includes opening a feedback path of the first PLL with respect to an input of a phase frequency detector of the first PLL, wherein opening the feedback path disables loop feedback to the phase frequency detector, wherein the first VCO output signal is generated while the first PLL is unlocked to the open loop configuration.

2. The method of claim 1, further comprising generating a second signal based on a difference between a third frequency of the first VCO and the second frequency of the second VCO, wherein a second gain is determined based on the second signal.

3. The method of claim 2, wherein the first signal corresponds to a first frequency change of the first VCO responsive to an initial voltage increased by an offset voltage and wherein the second signal corresponds to a second frequency change of the first VCO responsive to the initial voltage decreased by the offset voltage.

4. The method of claim 1, further comprising:
applying an initial voltage to the first VCO;
coarsely locking the first VCO to an initial frequency;
coarsely locking the second VCO to the second frequency; and
increasing the initial voltage by an offset voltage,
wherein the first VCO generates the first VCO output signal having the first frequency in response to increasing the initial voltage by the offset voltage, and wherein the second VCO generates the second VCO output signal having the second frequency in response to coarsely locking the second VCO to the second frequency.

5. The method of claim 4, further comprising:
providing the first VCO output signal to a first input of a down-conversion circuit; and
providing the second VCO output signal to a second input of the down-conversion circuit;
wherein the down-conversion circuit generates the first signal in response to receiving the first VCO output signal and the second VCO output signal.

6. The method of claim 5, further comprising decreasing the initial voltage by the offset voltage, wherein the first VCO generates a third VCO output signal having a third frequency in response to decreasing the initial voltage by the offset voltage.

7. The method of claim 6, further comprising providing the third VCO output signal to the first input of the down-conversion circuit, wherein the down-conversion circuit generates a second signal in response to receiving the third VCO output signal and the second VCO output signal.

8. The method of claim 7, further comprising determining a second gain of the first VCO based on the second signal.

9. The method of claim 8, further comprising determining a VCO gain based on the first gain and the second gain.

10. The method of claim 4, wherein the second frequency is approximately equal to the initial frequency.

11. The method of claim 4, wherein the first VCO generates an initial VCO output signal having the initial frequency in response to coarsely locking the first VCO to the initial frequency.

12. The method of claim 1, further comprising:
applying an initial voltage to the first VCO;
performing a coarse tune and acquisition of the first VCO to the first frequency, wherein the first VCO generates the first VCO output signal having the first frequency in response to performing the coarse tune and acquisition;
coarsely locking the second VCO to the second frequency, wherein the second VCO generates the second VCO output signal having the second frequency in response to coarsely locking the second VCO to the second frequency;
providing the first VCO output signal to a first input of a down-conversion circuit;
providing the second VCO output signal to a second input of the down-conversion circuit
decreasing the initial voltage by an offset voltage, wherein the first VCO generates a third VCO output signal having a third frequency in response to decreasing the initial voltage by the offset voltage; and
generating a second signal by providing the third VCO output signal to the first input of the down-conversion circuit and providing the second VCO output signal to the second input of the down-conversion circuit,
wherein the first gain is determined based on the first signal and the second signal.

13. The method of claim 1, wherein the first VCO is within a transmitter of a mobile phone and wherein the first gain is determined during a call at the mobile phone.

14. The method of claim 13, wherein the first gain is determined during an automatic gain control (AGC) transition of the transmitter.

15. The method of claim 14, wherein multiple gain values of a multipoint calibration are determined within a twenty-five microsecond AGC transition period in compliance with a wideband code division multiple access (WCDMA) protocol.

16. An apparatus comprising:
a down-conversion circuit having a first input coupled to receive a first voltage controlled oscillator (VCO) output signal from a first VCO of a first phase lock loop (PLL) and having a second input coupled to receive a second VCO output signal from a second VCO, wherein the first VCO is a separate VCO than the second VCO, and wherein the first VCO generates the first VCO output signal and the second VCO generates the second VCO output signal based on a same reference signal; and
a frequency counter coupled to receive from an output of the down-conversion circuit a first signal that is based on a difference between a first frequency of the first VCO output signal and a second frequency of the second VCO output signal, wherein the frequency counter is configured to generate a counter output that is proportional to the difference between the first frequency and the second frequency, wherein the first PLL is unlocked to an open loop configuration with a feedback path of the first PLL opened with respect to an input of a phase frequency detector of the first PLL, wherein opening the feedback path disables loop feedback to the phase frequency detector, wherein the first VCO output signal is generated while the first PLL is unlocked to the open loop configuration.

17. The apparatus of claim 16, wherein the down-conversion circuit comprises at least one of a D-type flip-flop (DFF), an exclusive-or (XOR) gate, or a mixer.

18. The apparatus of claim 16, wherein the down-conversion circuit is a high-speed D-type flip-flop (DFF).

19. The apparatus of claim 18, wherein the first input is a clock input and the second input is a data input of the high-speed DFF.

20. The apparatus of claim 19, wherein the first signal corresponds to a down-converted ratio of a number of high-edge clock pulses at the clock input as compared to a number of signal transitions at the data input, wherein the high-edge clock pulses are responsive to the first frequency, and wherein signal transitions at the data input are responsive to the second frequency.

21. The apparatus of claim 20, wherein the frequency counter is further configured to receive a reference clock signal.

22. The apparatus of claim 21, wherein generating the counter output includes counting a number of cycles of the reference clock signal during a time period based on the first signal.

23. An apparatus comprising:
means for generating a first signal based on a difference between a first frequency of a first voltage controlled oscillator (VCO) output signal and a second frequency of a second VCO output signal, wherein the first VCO output signal is received from a first VCO of a first phase lock loop (PLL) and wherein the second VCO output signal is received from a second VCO, wherein the first VCO is a separate VCO than the second VCO, and wherein the first VCO generates the first VCO output signal and the second VCO generates the second VCO output signal based on a same reference signal; and means for receiving the first signal and generating an output that is proportional to the difference between the first frequency and the second frequency, wherein the first PLL is unlocked to an open loop configuration with a feedback path of the first PLL opened with respect to an input of a phase frequency detector of the first PLL, wherein opening the feedback path disables loop feedback to the phase frequency detector, wherein the first VCO output signal is generated while the first PLL is unlocked to the open loop configuration.

24. The apparatus of claim 23, wherein the means for generating the first signal includes a down-conversion circuit.

25. The apparatus of claim 24, wherein the down-conversion circuit comprises at least one of a D-type flip-flop (DFF), an exclusive-or (XOR) gate, or a mixer.

26. The apparatus of claim 23, wherein the means for receiving the first signal and generating the output includes a frequency counter.

* * * * *